(12) United States Patent
Shibayama

(10) Patent No.: US 10,855,255 B2
(45) Date of Patent: Dec. 1, 2020

(54) DIGITAL FILTER, FILTER PROCESSING METHOD, AND RECORDING MEDIUM

(71) Applicant: NEC Corporation, Tokyo (JP)

(72) Inventor: Atsufumi Shibayama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 365 days.

(21) Appl. No.: 15/779,568

(22) PCT Filed: Dec. 1, 2016

(86) PCT No.: PCT/JP2016/085688
§ 371 (c)(1),
(2) Date: May 29, 2018

(87) PCT Pub. No.: WO2017/094824
PCT Pub. Date: Jun. 8, 2017

(65) Prior Publication Data
US 2020/0304107 A1 Sep. 24, 2020

(30) Foreign Application Priority Data

Dec. 2, 2015 (JP) ................................ 2015-235786

(51) Int. Cl.
*H03H 17/02* (2006.01)
*G06F 17/15* (2006.01)

(52) U.S. Cl.
CPC ......... *H03H 17/0201* (2013.01); *G06F 17/15* (2013.01)

(58) Field of Classification Search
CPC ............... H03H 17/02; H03H 17/0201; H03H 17/0202; H03H 17/0213; H03H 17/0245;
(Continued)

(56) References Cited

U.S. PATENT DOCUMENTS 4,866,649 A * 9/1989 Fettweis ............ H03H 17/0201
708/317
6,230,176 B1 5/2001 Mizutani
(Continued)

FOREIGN PATENT DOCUMENTS

JP H11-203272 A 7/1999
JP 2003-115819 A 4/2003
(Continued)

OTHER PUBLICATIONS

International Search Report for PCT Application No. PCT/JP2016/085688, dated Feb. 14, 2017.
(Continued)

*Primary Examiner* — Andrew Caldwell
*Assistant Examiner* — Emily E Larocque

(57) ABSTRACT

The present invention addresses the problem of increasing the likelihood of making it possible to reduce the consumption of power necessary for filter processing and the amount of heat generated during filter processing. In order to overcome this problem, a second complex signal and a third complex signal are generated from a first complex signal in a frequency domain, the third complex signal being a complex conjugate of the second complex signal. Signal selection is performed from the plurality of types of complex signals having different amounts of change in signal amplitude. Processing is performed on the complex signal selected as the signal using a first filter coefficient and a second filter coefficient. The complex signals after filter processing are synthesized to generate a complex signal, which is then outputted.

10 Claims, 11 Drawing Sheets

(58) Field of Classification Search
CPC ......... H03H 2017/021; H03H 2218/02; H03H 2218/04; G06F 17/10; G06F 17/14; G06F 17/141; G06F 17/142; G06F 17/15; G06F 17/156
USPC .................................................. 708/300, 317
See application file for complete search history.

(56) References Cited

U.S. PATENT DOCUMENTS

| | | |
|---|---|---|
| 2004/0146095 A1 | 7/2004 | Umeno et al. |
| 2006/0031276 A1* | 2/2006 | Kumamoto ........... G06F 17/156 708/403 |
| 2014/0379771 A1 | 12/2014 | Shibayama et al. |
| 2015/0019608 A1 | 1/2015 | Shibayama et al. |
| 2016/0357705 A1 | 12/2016 | Shibayama |

FOREIGN PATENT DOCUMENTS

| | | |
|---|---|---|
| JP | 2005-065231 A | 3/2005 |
| WO | 2013/094308 A1 | 6/2013 |
| WO | 2013/125173 A1 | 8/2013 |
| WO | 2015/087495 A1 | 6/2015 |

OTHER PUBLICATIONS

English translation of Written opinion for PCT Application No. PCT/JP2016/085688.

\* cited by examiner

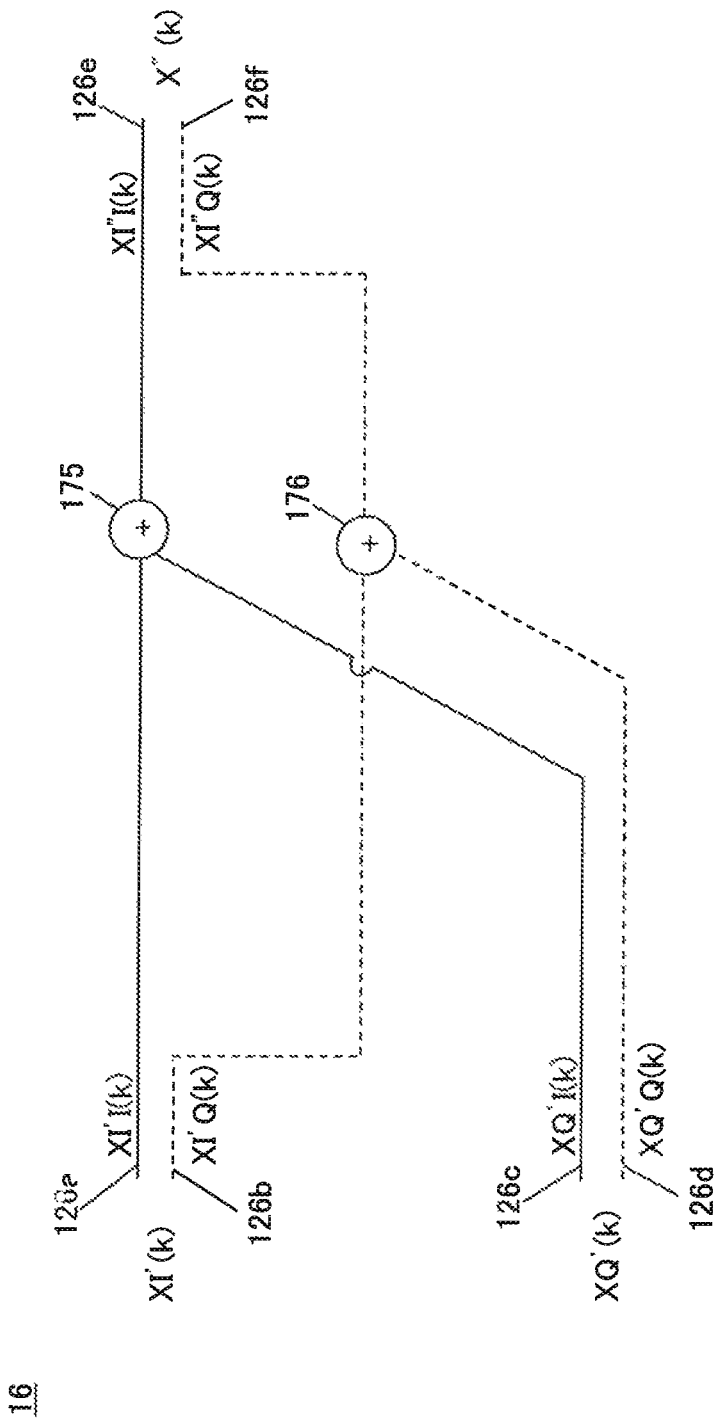

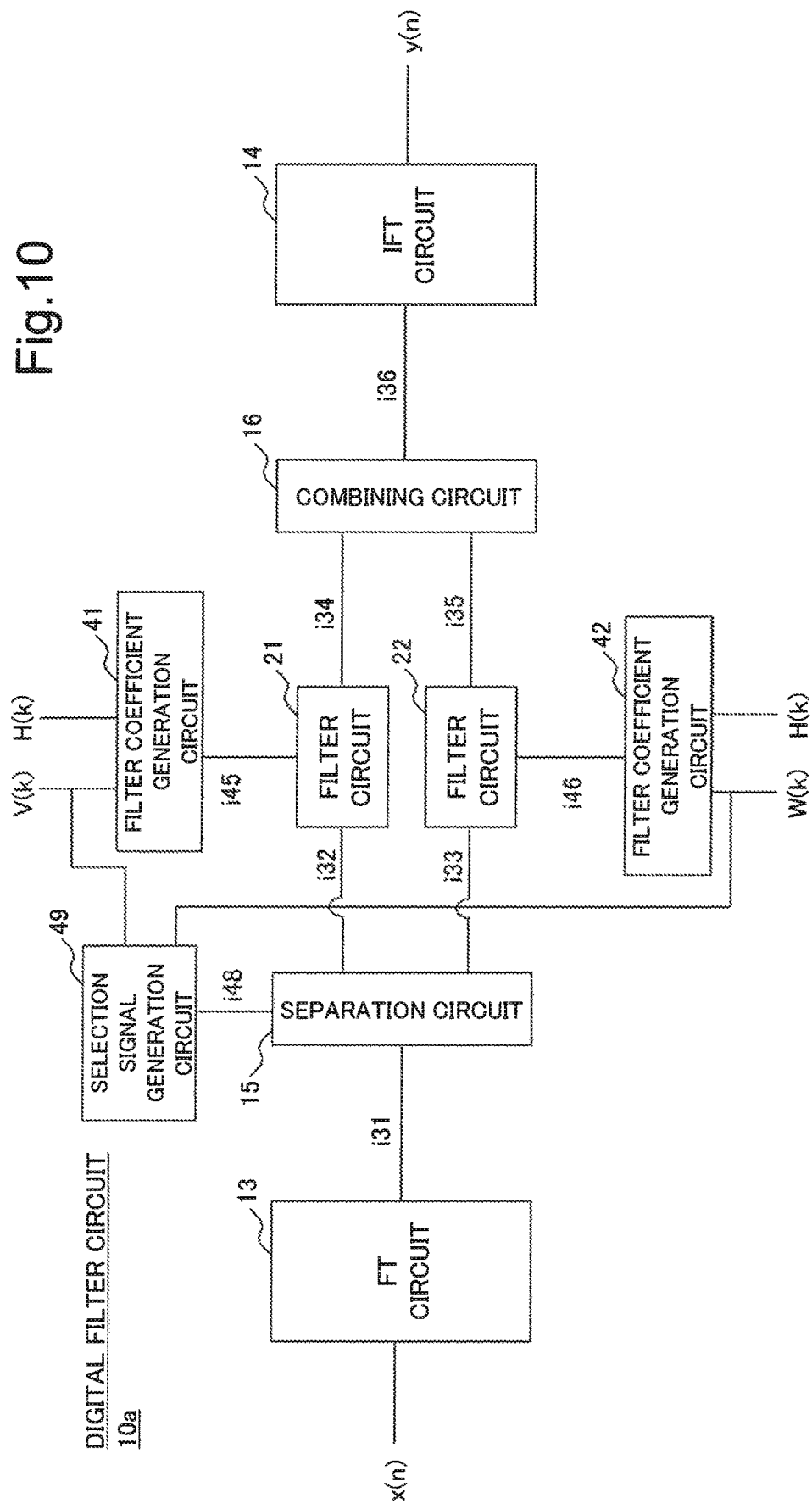

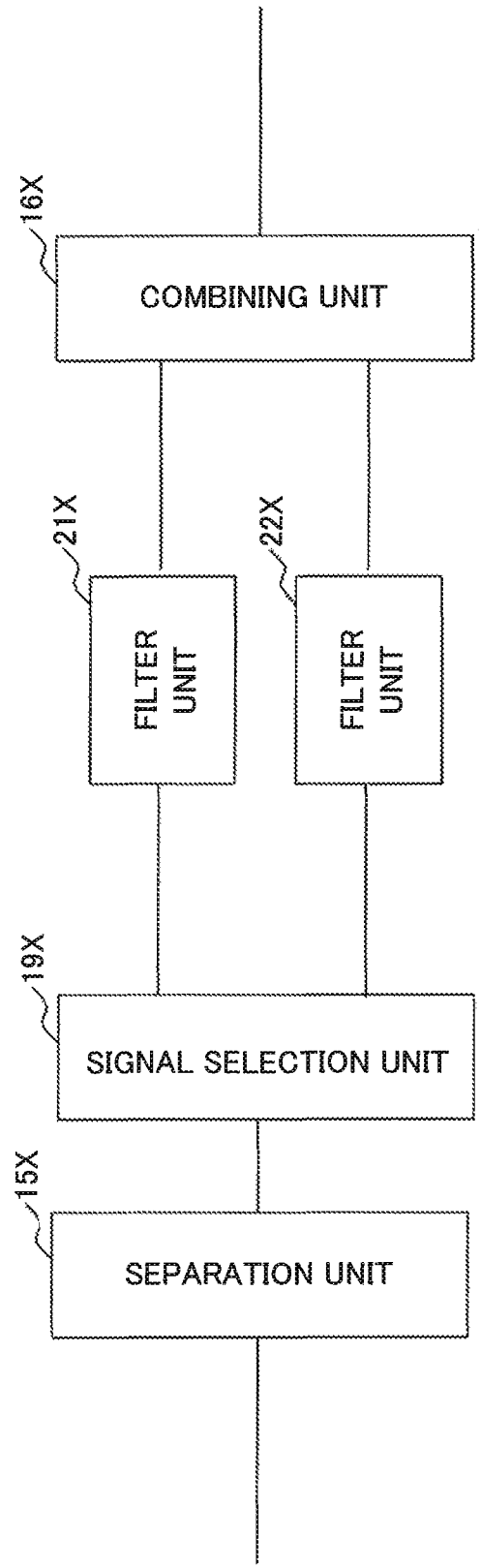

DIGITAL FILTER, FILTER PROCESSING METHOD, AND RECORDING MEDIUM

This application is a National Stage Entry of PCT/JP2016/085688 filed on Dec. 1, 2016, which claims priority from Japanese Patent Application 2015-235786 filed on Dec. 2, 2015, the contents of all of which are incorporated herein by reference, in their entirety.

TECHNICAL FIELD

The present invention relates to arithmetic processing in digital signal processing, and more particularly, to a digital filter, a filter processing method, and a filter processing program.

BACKGROUND ART

As a method for performing filter processing on a complex signal in a time domain, PTL 1 discloses the following filter processing method by a digital filter.

First of all, a digital filter transforms a complex signal in a time domain into a first complex signal in a frequency domain by Fourier transform. Next, a second complex signal including respective complex conjugates of all complex numbers constituting the first complex signal is generated. Then, filter processing by a predetermined frequency-domain filter coefficient is performed on each of the first complex signal and the second complex signal. Then, the first complex signal after filter processing, and the second complex signal after filter processing are combined, and a complex signal in a frequency domain after filter processing is generated. Further, inverse Fourier transform is performed on the complex signal in a frequency domain after filter processing, and a time-domain complex signal after filter processing is acquired.

Further, PTL 1 discloses the following method for generating a frequency-domain filter coefficient by a filter coefficient generation means. Specifically, the filter coefficient generation means generates the frequency-domain filter coefficient by adding a second input filter coefficient to a first input filter coefficient by complex addition, and then, multiplying the third input filter coefficient with a complex multiplication. Further, the filter coefficient generation means generates a second frequency-domain filter coefficient by subtracting the second input filter coefficient from a first input filter coefficient by complex subtraction, and then, multiplying the result by the third input filter coefficient by complex multiplication.

Note that, in association with the present invention, PTL 2 discloses a digital filter circuit including a Fourier transform means, an IQ separation means, two filter means, an IQ combining means, a third filter means, and an inverse Fourier transform means.

Further, in association with the present invention, PTL 3 discloses a signal processing device including a discrete Fourier transform unit, a vector multiplication circuit, and an inverse discrete Fourier transform unit.

Further, in association with the present invention, PTL 4 discloses a fast Fourier transform processing device for performing predetermined arithmetic processing.

CITATION LIST

Patent Literature

[PTL 1] International Publication No. WO2013/125173
[PTL 2] International Publication No. WO2013/094308
[PTL 3] Japanese Laid-open Patent Publication No. 2005-065231
[PTL 4] Japanese Laid-open Patent Publication No. H11-203272

SUMMARY OF INVENTION

Technical Problem

However, the digital filter disclosed in PTL 1 performs filter processing on a second complex signal, and a third complex signal being conjugate of the second complex signal, which are generated from a first complex signal by a complex separation unit. Since the second complex signal and the third complex signal have predetermined signal amplitudes, there is a problem that power consumption required for filter processing, and an amount of heat generated when filter processing is performed are large.

An object of the present invention is to solve the problem described above, and to provide a digital filter and the like, which can increase a possibility that power consumption required for filter processing, and an amount of heat generated when filter processing is performed can be reduced.

Solution to Problem

A digital filter according to the present invention includes a separation unit, a signal selection unit, a first filter unit, a second filter unit, and a combining unit.

The separation unit generates, from a first complex signal in a frequency domain output to the separation unit, a second complex signal and a third complex signal being a complex conjugate of the second complex signal. The separation unit outputs the second complex signal and the third complex signal to the signal selection unit.

The signal selection unit performs switching by selecting, from among a plurality of types of complex signals having different amounts of change in signal amplitude, by using the second complex signal and the third complex signal output to the signal selection unit by the separation unit. The signal selection unit performs the switching with respect to at least one of a fourth complex signal to be output to the first filter unit and a fifth complex signal to be output to the second filter unit by the signal selection unit.

The first filter unit performs filter processing on the fourth complex signal by a first filter coefficient, and generates a sixth complex signal. The first filter unit outputs the sixth complex signal to the combining unit.

The second filter unit performs processing on the fifth complex signal by a second filter coefficient, and generates a seventh complex signal. The second filter unit outputs the seventh complex signal to the combining unit.

The combining unit combines the sixth complex signal and the seventh complex signal, and generates and outputs an eighth complex signal being a complex signal after combining.

Advantageous Effects of Invention

The digital filter and the like according to the present invention are able to increase a possibility that power consumption required for filter processing, and an amount of heat generated when filter processing is performed can be reduced.

BRIEF DESCRIPTION OF DRAWINGS

FIG. 9 is a conceptual diagram illustrating a configuration example of a combining circuit.

FIG. 10 is a conceptual diagram illustrating a configuration example of a digital filter circuit according to a second example embodiment.

FIG. 11 is a conceptual diagram illustrating a minimum configuration of a digital filter according to the present invention.

EXAMPLE EMBODIMENT

First Example Embodiment

[Configuration and Operation]

Figure 1:
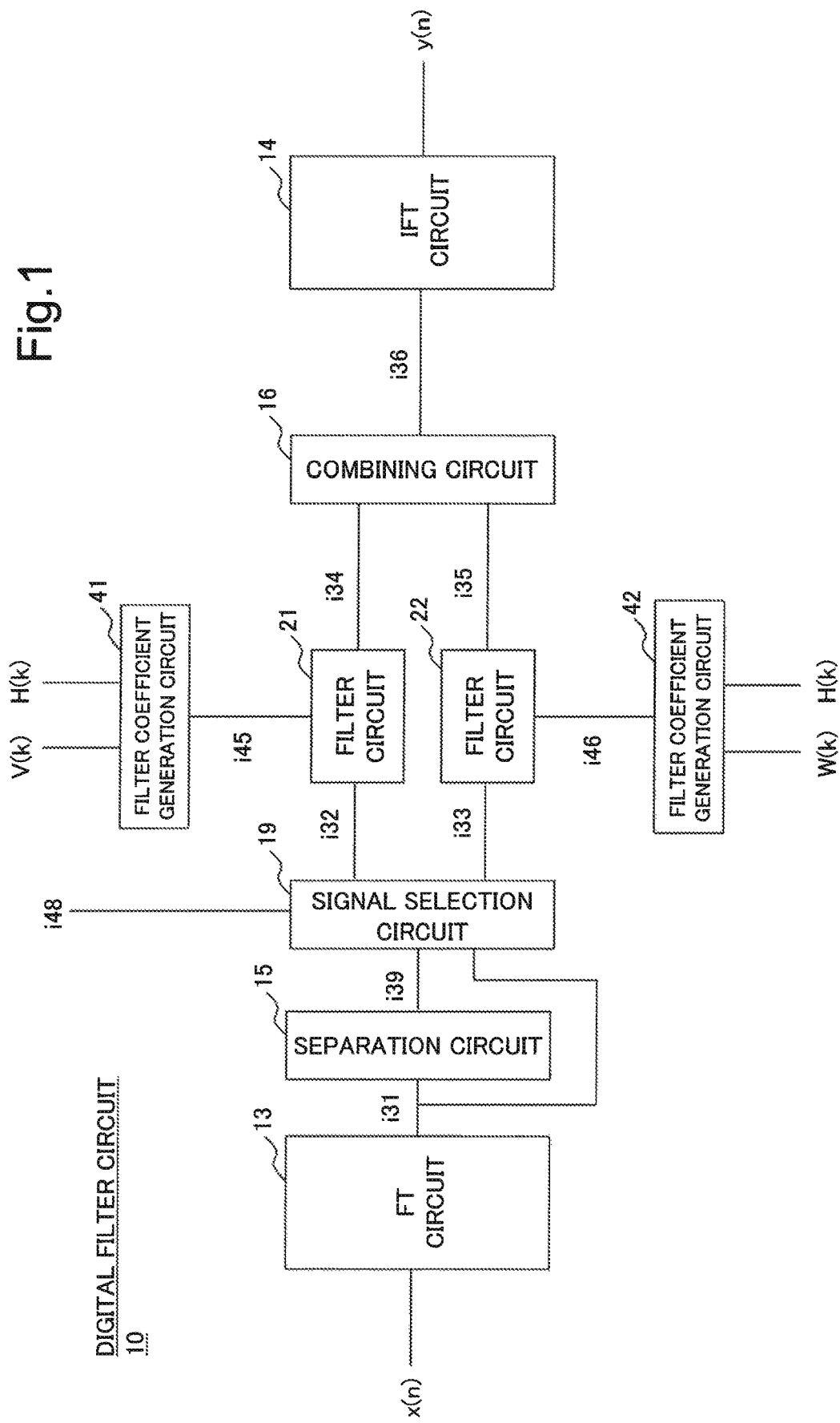
FIG. 1 is a conceptual diagram illustrating a configuration example of a digital filter circuit according to a first example embodiment.

FIG. 1 is a conceptual diagram illustrating a configuration of a digital filter circuit 10 being an example of a digital filter circuit according to a first example embodiment. Further, FIG. 2 is a sequence chart illustrating an operation example to be performed by the digital filter circuit 10.

As illustrated in FIG. 1, the digital filter circuit 10 includes an FT circuit 13, an IFT circuit 14, a separation circuit 15, and a combining circuit 16. Herein, "FT" means Fourier transform, and "IFT" means inverse Fourier transform, respectively. The digital filter circuit 10 further includes a filter circuit 21, a filter circuit 22, a filter coefficient generation circuit 41, and a filter coefficient generation circuit 42.

Figure 2:
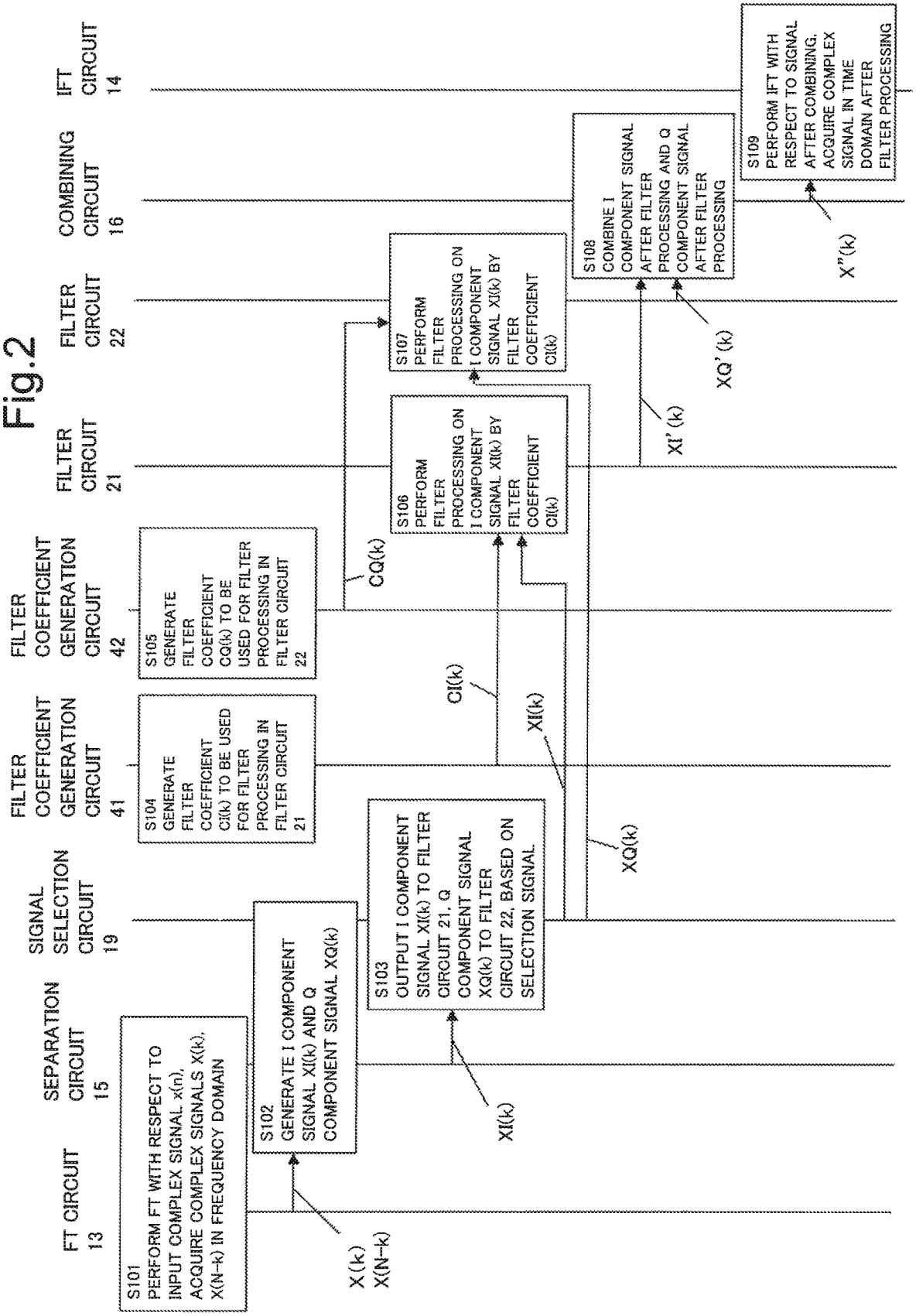
FIG. 2 is a sequence chart illustrating an operation example to be performed by the digital filter circuit.

The FT circuit 13 performs the following operation illustrated in S101 in FIG. 2.

A complex signal x(n) in a time domain $$x(n)=r(n)+js(n) \tag{1}$$

is input to the FT circuit 13.

The FT circuit 13 performs FT on the input complex signal x(n), and generates a complex signal X(k) in a frequency domain.

$$X(k)=R(k)+jS(k) \tag{2}$$

Herein, n is an integer representing a signal sample number in a time domain: $0 \le n \le N-1$, N is an integer representing a transform sample number of FT: $0 < N$, and k is an integer representing a frequency number in a frequency domain: $0 \le k \le N-1$.

Further, the FT circuit 13 generates a complex signal X(N−k) from the complex signal X(k).

$$X(N-k)=R(N-k)+jS(N-K) \tag{3}$$

The FT circuit 13 outputs a complex signal i31 including the complex signal X(k) and the complex signal X(N−k) to the separation circuit 15 and a signal selection circuit 19.

As FT, for example, it is possible to use fast Fourier transform (FFT) being one of methods for performing fast Fourier transform. An example of FFT is disclosed in PTL 4.

Next, the separation circuit 15 performs the following operation illustrated in S102 in FIG. 2.

The separation circuit 15 generates an I component signal XI(k) and a Q component signal XQ(k) being a pair of complex conjugates of X(k) as will be described later, by using the complex signal X(k) and the complex signal X(N−k) output to the separation circuit 15 by the FT circuit 13.

The separation circuit 15 generates a complex conjugate X*(N−k) of the complex signal X(N−K)

$$X*(N-k)=R(N-k)-jS(N-k) \tag{4}$$

by using the complex signal X(N−k) output to the separation circuit 15 by the FT circuit 13, regarding each frequency number k: $0 \le k \le N-1$.

The separation circuit 15 further generates an I component signal XI(k)

$$\begin{aligned} XI(k) &= \{X(k) - X*(N-k)\}/2 \\ &= \{R(k) + R(N-k)\}/2 + j\{S(k) + S(N-k)\}/2 \end{aligned} \tag{5}$$

and the Q component signal XQ(k).

$$\begin{aligned} XQ(k) &= \{X(k) - X*(N-k)\}/2 \\ &= \{R(k) - R(N-k)\}/2 + j\{S(k) + S(N-k)\}/2 \end{aligned} \tag{6}$$

The separation circuit 15 outputs a complex signal i32 including the generated I component signal XI(k) and the generated Q component signal XQ(k) to the signal selection circuit 19.

Next, the signal selection circuit 19 performs the following operation illustrated in S103 in FIG. 2.

A selection signal i48 is input to the signal selection circuit 19. The selection signal i48 is supplied from a part constituting a host device of the digital filter circuit 10, for example.

The signal selection circuit 19 performs signal selection based on a selection mode included in the selection signal i48. The selection signal i48 is a signal including a content designating one of a first selection mode and a second selection mode.

When the selection signal i48 includes a content designating the first selection mode, the signal selection circuit 19 performs selection of an output signal to the filter circuits 21 and 22 based on the first selection mode. When the signal selection circuit 19 performs selection of an output signal to the filter circuits 21 and 22 based on the first selection mode, the digital filter circuit 10 performs filter processing based on the first selection mode.

Further, when the selection signal i48 includes a content designating the second selection mode, the signal selection circuit 19 performs selection of an output signal to the filter circuits 21 and 22 based on the second selection mode. When the signal selection circuit 19 performs selection of an output signal to the filter circuits 21 and 22 based on the second selection mode, the digital filter circuit 10 performs filter processing based on the second selection mode.

When the selection mode is the first selection mode, the signal selection circuit 19 outputs, to the filter circuit 21, the complex signal i32 including the I component signal XI(k) expressed by Eq. (5). Further, the signal selection circuit 19 outputs, to the filter circuit 22, a complex signal i33 including the Q component signal XQ(k) expressed by Eq. (6).

On the other hand, when the selection mode is the second selection mode, the signal selection circuit 19 generates an I component signal XI(k)

$$XI(k) = X(k) \quad (5')$$
$$= R(k) + jS(k)$$

and a Q component signal XQ(k)

$$XQ(k)=0 \quad (6')$$

from the complex signal X(k).

Further, the signal selection circuit 19 outputs, to the filter circuit 21, the complex signal i32 including the I component signal XI(k) expressed by Eq. (5'). Further, the signal selection circuit 19 outputs, to the filter circuit 22, the complex signal i33 including the Q component signal XQ(k) expressed by Eq. (6').

The filter coefficient generation circuit 41 performs the following operation illustrated in S104 in FIG. 2.

A complex coefficient V(k) and a complex coefficient H(k) are output to the filter coefficient generation circuit 41. The output is performed by a part constituting a host device of the digital filter circuit 10, for example.

The filter coefficient generation circuit 41 generates a filter coefficient CI(k) from the complex coefficients V(k) and H(k) output to the filter coefficient generation circuit 41 by an external unit, regarding each frequency number k: 0≤k≤N−1.

$$CI(k)=V(k)\times H(k) \quad (7)$$

On the other hand, the filter coefficient generation circuit 42 performs the following operation illustrated in S105 in FIG. 2.

Complex coefficients W(k) and H(k) are output to the filter coefficient generation circuit 42. The output is performed by a part constituting a host device of the digital filter circuit 10, for example.

Further, the filter coefficient circuit 42 generates a complex coefficient from the input complex coefficients W(k) and H(k), regarding each frequency number k: 0≤k≤N−1.

$$CQ(k)=W(k)\times H(k) \quad (8)$$

Herein, the complex coefficients V(k), W(k), and H(k) are coefficients in a frequency domain, which are associated with a real filter coefficient when filter processing by real number operation is performed in a time domain. Details on V(k), W(k), and H(k) will be described later.

The filter coefficient generation circuit 41 includes the generated filter coefficient CI(k) in a complex signal i45, and outputs the complex signal i45 to the filter circuit 21. Further, the filter coefficient generation circuit 42 includes the generated filter coefficient CQ(k) in a complex signal i46, and outputs the complex signal i46 to the filter circuit 22.

The filter circuit 21 performs the following operation illustrated in S106 in FIG. 2.

The filter circuit 21 performs complex filter processing by complex multiplication on the I component signal XI(k) included in the complex signal i32 output to the filter circuit 21 by the signal selection unit. The filter circuit 21 uses the filter coefficient CI(k) included in the complex signal i45 output to the filter circuit 21 by the filter coefficient generation circuit 41, when the complex filter processing is performed. Specifically, the filter circuit 21 calculates a complex signal XI'(k) regarding each frequency number k: 0≤k≤N−1, and outputs a complex signal i34 including the complex signal XI' to the combining circuit 16.

$$XI'(k)=XI(k)\times CI(k) \quad (9)$$

The filter circuit 22 performs the following operation illustrated in S107 in FIG. 2.

The filter circuit 22 performs complex filter processing by complex multiplication on the Q component signal XQ(k) included in the complex signal i33 output to the filter circuit 22 by the signal selection unit 19. The filter circuit 22 uses the filter coefficient CQ(k) included in the complex signal i46 output to the filter circuit 22 by the filter coefficient generation circuit 42, when complex filter processing by the complex multiplication is performed. Specifically, the filter circuit 22 calculates a complex signal XQ'(k) regarding each frequency number k: 0≤k≤N−1, and outputs a complex signal i35 including the complex signal XQ'(k) to the combining circuit 16.

$$XQ'(k)=XQ(k)\times CQ(k) \quad (10)$$

Herein, it is possible to write the filter coefficients CI(k) and CQ(k) by dividing each of the filter coefficients CI(k) and CQ(k) into a real part and an imaginary part.

$$CI(k)=CII(k)+jCIQ(k) \quad (11)$$

$$CQ(k)=CQI(k)+jCQQ(k) \quad (12)$$

The combining circuit 16 performs the following operation illustrated in S108 in FIG. 2.

The combining circuit 16 generates a complex signal X"(k), which is acquired by combining the complex signal XI'(k) expressed by Eq. (9) and the complex signal XQ'(k) expressed by Eq. (10). Herein, the complex signal XI'(k) is a complex signal included in the complex signal i34 to be output to the combining circuit 16 by the filter circuit 21. Further, the complex signal XQ'(k) is a complex signal included in the complex signal i35 to be output to the combining circuit 16 by the filter circuit 22.

Specifically, the combining unit 16 calculates the complex signal X"(k) regarding each frequency number k: 0≤k≤N−1, and outputs a complex signal i36 including the complex signal X"(k) to the IFT circuit 14.

$$X''(k)=XI'(k)+XQ'(k) \quad (13)$$

The combining circuit 16 performs the following operation illustrated in S109 in FIG. 2.

The IFT circuit 14 performs inverse Fourier transform (hereinafter, referred to as "IFT") on the complex signal X"(k) (see Eq. (13)) included in the complex signal i36 to be output to the IFT circuit 14 by the combining unit 16, regarding each frequency number k:≤0≤k≤N−1. Further, the IFT circuit 14 generates a complex signal x"(n) in a time domain by the IFT. The IFT circuit 14 further outputs a signal y(n) including the complex signal x"(n) to an external unit of the unillustrated digital filter circuit 10.

Figure 3:
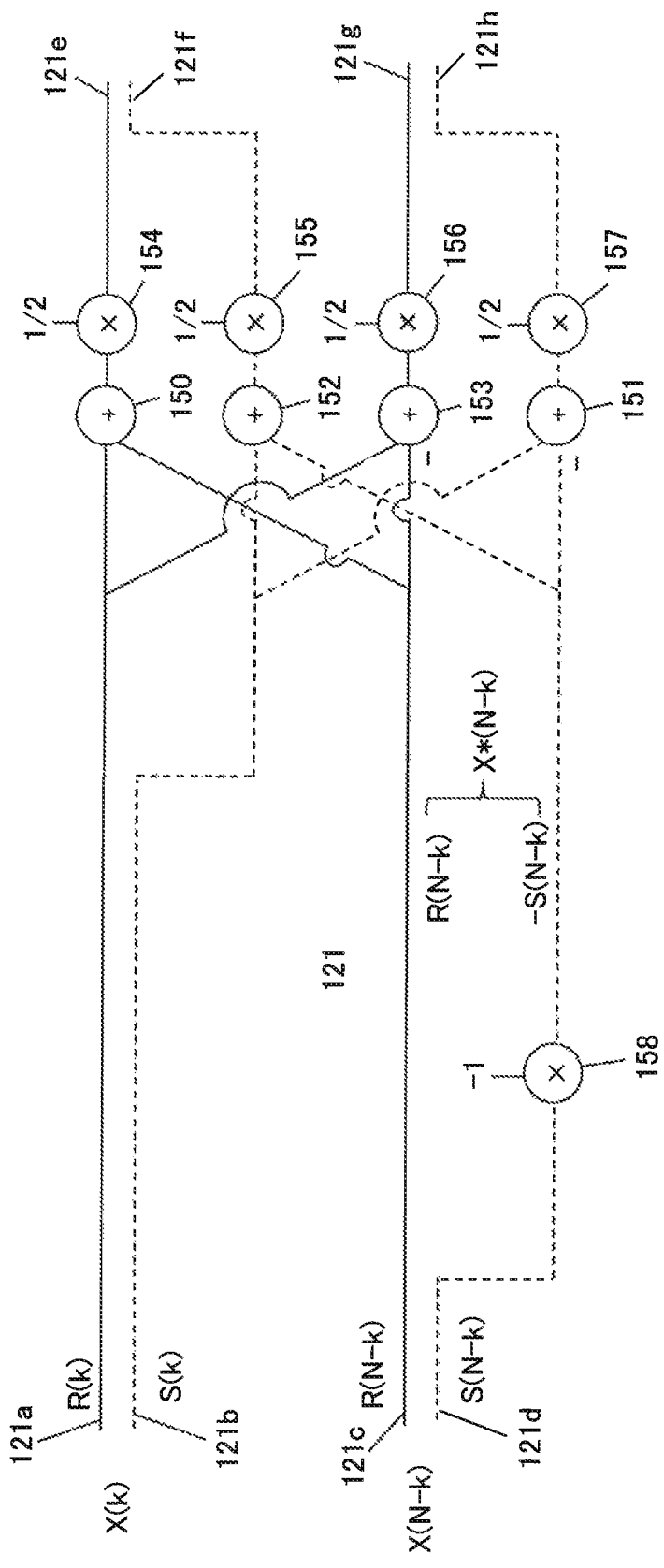
FIG. 3 is a conceptual diagram illustrating a configuration example of a separation circuit.

FIG. 3 is a conceptual diagram illustrating a configuration example of the separation unit 15 being an example of a separation circuit. Among lines indicating signal paths illustrated in FIG. 3, solid lines indicate signal paths of real parts of signals, and dotted lines indicate signal paths of imaginary parts of the signals.

The separation circuit 15 includes adder circuits 150 and 152, subtraction circuits 151 and 153, and multiplication circuits 154 to 158.

Complex signals X(k) and X(N−k) are input to the separation circuit 15. Herein, the complex signals X(k) and X(N−k) are complex signals included in the complex signal i31 to be transmitted to the separation circuit 15 by the FT circuit 13, which is described with reference to FIG. 1.

A real part R(k) of the complex signal X(k) input to the separation circuit 15 is input to a terminal 121a.

An imaginary part S(k) of the complex signal X(k) input to the separation circuit 15 is input to a terminal 121b.

A real part R(N−k) of the complex signal X(N−k) input to the separation circuit 15 is input to a terminal 121c. R(N−k) is also a real part of a complex conjugate X*(N−k) of the complex signal X(N−k).

An imaginary part S(N−k) of the complex signal X(N−k) input to the separation circuit 15 is input to a terminal 121d.

When the FT circuit 13 transmits the complex signal i31 to the separation circuit 15 through one signal line, the separation circuit 15 includes an unillustrated separation circuit for separating the complex signal i31. The separation circuit separates, from the complex signal i31, the real part R(k) of the complex signal X(k), the imaginary part S(k) of the complex signal X(k), the real part R(N−k) of the complex signal X(N−k), and the imaginary part S(N−k) of the complex signal X(N−k). Further, the separation circuit outputs the real part R(k) of the complex signal X(k) to the terminal 121a, and outputs the imaginary part S(k) of the complex signal X(k) to the terminal 121b. The separation circuit further outputs the real part R(N−k) of the complex signal X(N−k) to the terminal 121c, and outputs the imaginary part S(N−k) of the complex signal X(N−k) to the terminal 121d.

The real part R(k) of the complex signal X(k) input to the terminal 121a is transmitted to the adder circuit 150 and the subtraction circuit 153.

The imaginary part S(k) of the complex signal X(k) input to the terminal 121b is transmitted to the adder circuit 152 and the subtraction circuit 151.

The real part R(N−k) of the complex signal X(N−k) input to the terminal 121c is transmitted to the adder circuit 150 and the subtraction circuit 153.

The imaginary part S(N−k) of the complex signal X(N−k) input to the terminal 121d is transmitted to the adder circuit 152 and the subtraction circuit 151.

The multiplication circuit 158 multiplies the imaginary part S(N−k) transmitted to the multiplication circuit 158 by a value of −1, and acquires an imaginary part −S(N−k). The imaginary part −S(N−k) is an imaginary part of the complex conjugate X*(N−k) of the complex signal X(N−k). The multiplication circuit 158 transmits −S(N−k) to the adder circuit 152 and the subtraction circuit 151.

The adder circuit 150 adds the real part R(k) transmitted from the terminal 121a and the real part R(N−k) transmitted from the terminal 121c, and acquires a real part R(k)+R(N−k). The adder circuit 150 transmits the real part R(k)+R(N−k) to the multiplication circuit 154.

The multiplication circuit 154 multiplies the real part R(k)+R(N−k) transmitted from the adder circuit 150 by a value of ½, and acquires a real part (R(k)+R(N−k))/2. The multiplication circuit 154 transmits the real part (R(k)+R(N−k))/2 to the signal selection circuit 19 illustrated in FIG. 1 through a terminal 121e.

The adder circuit 152 adds the imaginary part S(k) transmitted from the terminal 121b and the imaginary part −S(N−k) transmitted to the adder circuit 152 by the multiplication circuit 158, and acquires an imaginary part S(k)−S(N−k). The adder circuit 152 transmits the imaginary part S(k)−S(N−k) to the multiplication circuit 155.

The multiplication circuit 155 multiplies the imaginary part S(k)−S(N−k) transmitted from the adder circuit 152 by a value of ½, and acquires an imaginary part (S(k)−S(N−k))/2. The multiplication circuit 155 transmits the imaginary part (S(k)−S(N−k))/2 to the signal selection circuit 19 illustrated in FIG. 1 through a terminal 121f.

The subtraction circuit 153 subtracts the real part R(N−k) transmitted to the subtraction circuit 153 by the separation circuit 113, from the real part R(k) transmitted from the terminal 121a, and acquires a real part R(k)−R(N−k). The subtraction circuit 153 transmits the real part R(k)−R(N−k) to the multiplication circuit 156.

The multiplication circuit 156 multiplies the real part R(k)−R(N−k) transmitted to the multiplication circuit 156 by the subtraction circuit 153 by a value of ½, and acquires a real part (R(k)−R(N−k))/2. The multiplication circuit 156 transmits the real part (R(k)−R(N−k))/2 to the signal selection circuit 19 illustrated in FIG. 1 through a terminal 121g.

The subtraction circuit 151 subtracts the imaginary part −S(N−k) transmitted to the subtraction circuit 151 by the multiplication circuit 158, from the imaginary part S(k) transmitted from the terminal 121b, and acquires an imaginary part S(k)+S(N−k). The subtraction circuit 151 transmits the imaginary part S(k)+S(N−k) to the multiplication circuit 157.

The multiplication circuit 157 multiplies the imaginary part S(k)+S(N−k) transmitted to the multiplication circuit 157 by the subtraction circuit 151, and acquires an imaginary part (S(k)+S(N−k))/2. The multiplication circuit 157 transmits the imaginary part (S(k)+S(N−k))/2 to the signal selection circuit 19 illustrated in FIG. 1 through a terminal 121h.

Herein, from Eq. (5), combination of the real part (R(k)+R(N−k))/2 and the imaginary part (S(k)+S(N−k))/2 is the I component signal XI(k).

Further, from Eq. (6), combination of the real part (R(k)−R(N−k))/2 and the imaginary part (S(k)−S(N−k))/2 is the Q component signal XQ(k).

Specifically, the separation circuit 15 performs an operation of separating an input complex signal into the I component signal XI(k) and the Q component signal XQ(k), and outputting to the signal selection circuit 19.

Figure 4:
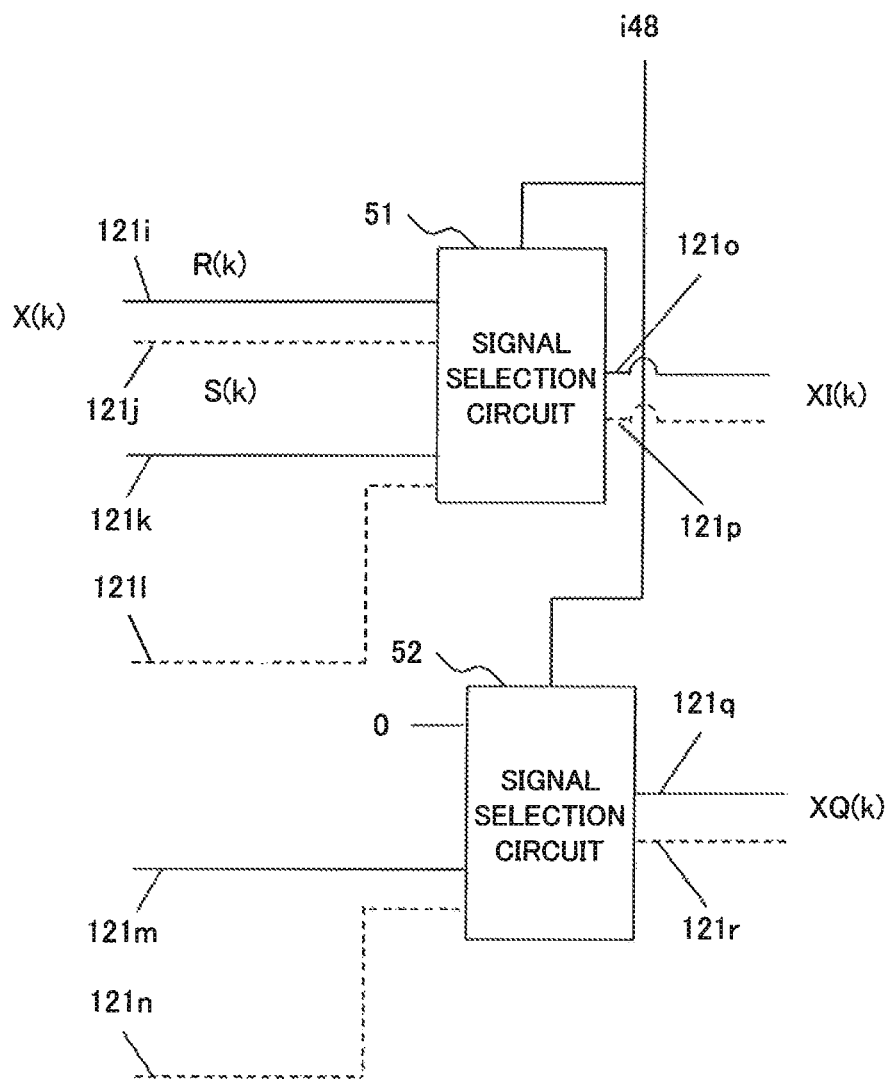
FIG. 4 is a conceptual diagram illustrating a configuration example of a signal selection circuit.

FIG. 4 is a conceptual diagram illustrating a configuration example of the signal selection circuit 19.

The signal selection circuit 19 includes a signal selection circuit 51 and a signal selection circuit 52.

The real part R(k) of the complex signal X(k) is input to the signal selection circuit 51 through a terminal 121i.

Further, the imaginary part S(k) of the complex signal X(k) is input to the signal selection circuit 51 through a terminal 121j.

The complex signal X(k) is the complex signal X(k) included in the complex signal i31 output to the signal selection circuit 19 by the FT circuit 13 illustrated in FIG. 1.

Further, the real part (R(k)+R(N−k))/2 is input to the signal selection circuit 51 through a terminal 121k. The real part (R(k)+R(N−k))/2 is the real part (R(k)+R(N−k))/2 to be transmitted to the signal selection circuit 19 by the multiplication circuit 154 of the separation circuit 15 illustrated in FIG. 3 through the terminal 121e.

Further, the real part (R(k)−R(N−k))/2 is input to the signal selection circuit 51 through a terminal 121l. The real part (R(k)−R(N−k))/2 is the real part (R(k)−R(N−k))/2 to be transmitted to the signal selection circuit 19 by the multiplication circuit 156 of the separation circuit 15 illustrated in FIG. 3 through the terminal 121g.

On the other hand, the imaginary part (S(k)−S(N−k))/2 is input to the signal selection circuit 52 through a terminal 121m. The imaginary part (S(k)−S(N−k))/2 is the imaginary part (S(k)−S(N−k))/2 to be transmitted to the signal selection circuit 19 by the multiplication circuit 155 of the separation circuit 15 illustrated in FIG. 3 through the terminal 121f.

Further, the imaginary part (S(k)+S(N−k))/2 is input to the signal selection circuit 52 through a terminal 121n. The imaginary part (S(k)+S(N−k))/2 is the imaginary part (S(k)+S(N−k))/2 to be transmitted to the signal selection circuit 19 by the multiplication circuit 157 of the separation circuit 15 illustrated in FIG. 3 through the terminal 121h.

The signal selection circuit 51 holds the complex signal X(k) and the I component signal XI(k). The complex signal X(k) is the I component signal XI(k) expressed by Eq. (5'). Further, the I component signal XI(k) transmitted to the signal selection circuit 51 by a combining circuit 122 is the I component signal XI(k) expressed by Eq. (5).

The selection signal i48 to be input to the signal selection circuit 19 is input to the signal selection circuits 51 and 52. The selection signal i48 is the selection signal i48 to be output to the signal selection circuit 19 by an external unit of the digital filter circuit 10, which has been described with reference to FIG. 1.

When the selection mode included in the selection signal i48 input to the signal selection circuit 51 is a selection mode 1, the signal selection circuit 51 outputs the I component signal XI(k) expressed by Eq. (5) to the filter circuit 21 illustrated in FIG. 1. Specifically, the signal selection circuit 51 outputs a real part of the I component signal XI(k) from the terminal 121e, and outputs an imaginary part of the I component signal XI(k) from the terminal 121f to the filter circuit 21 illustrated in FIG. 1. The signal selection circuit 51 may output the I component signal XI(k) as it is to the filter circuit 21 illustrated in FIG. 1, as the signal i32 illustrated in FIG. 1. Alternatively, the signal selection circuit 51 may include an unillustrated combining circuit at a post stage of the terminal 121e and the terminal 121f. Further, the combining circuit may output a signal acquired by combining a real part of the I component signal XI(k) and an imaginary part of the I component signal XI(k) to the filter circuit 21 illustrated in FIG. 1, as the signal i32 illustrated in FIG. 1.

On the other hand, a description on an operation of the signal selection circuit 51 when the selection mode included in the selection signal i48 is a selection mode 2 is a description in which Eq. (5) is read as Eq. (5') in the description on an operation of the signal selection circuit 51.

When the selection mode included in the selection signal i48 input to the signal selection circuit 52 is the selection mode 1, the signal selection circuit 52 outputs the complex signal X(k) expressed by Eq. (6) to the filter circuit 22, as the Q component signal XQ(k). Specifically, the signal selection circuit 52 outputs a real part of the Q component signal XQ(k) from the terminal 121g, and outputs an imaginary part of the Q component signal XQ(k) from the terminal 121h to the filter circuit 22 illustrated in FIG. 1. The signal selection circuit 52 may output the Q component signal XQ(k) to the filter circuit 22 illustrated in FIG. 1, as the complex signal i33 illustrated in FIG. 1. The signal selection circuit 52 may include an unillustrated combining circuit at a post stage of the terminal 121g and the terminal 121h. Further, the combining circuit may output a signal acquired by combining a real part of the Q component signal XQ(k) and an imaginary part of the Q component signal XQ(k) to the filter circuit 22 illustrated in FIG. 1, as the complex signal i33 illustrated in FIG. 1.

On the other hand, a description on an operation of the signal selection circuit 52 when the selection mode included in the selection signal i48 is the selection mode 2 is a description in which Eq. (6) is read as Eq. (6') in the description on an operation of the signal selection circuit 52.

Next, a specific example of a filter coefficient generation circuit is described.

Figure 5:
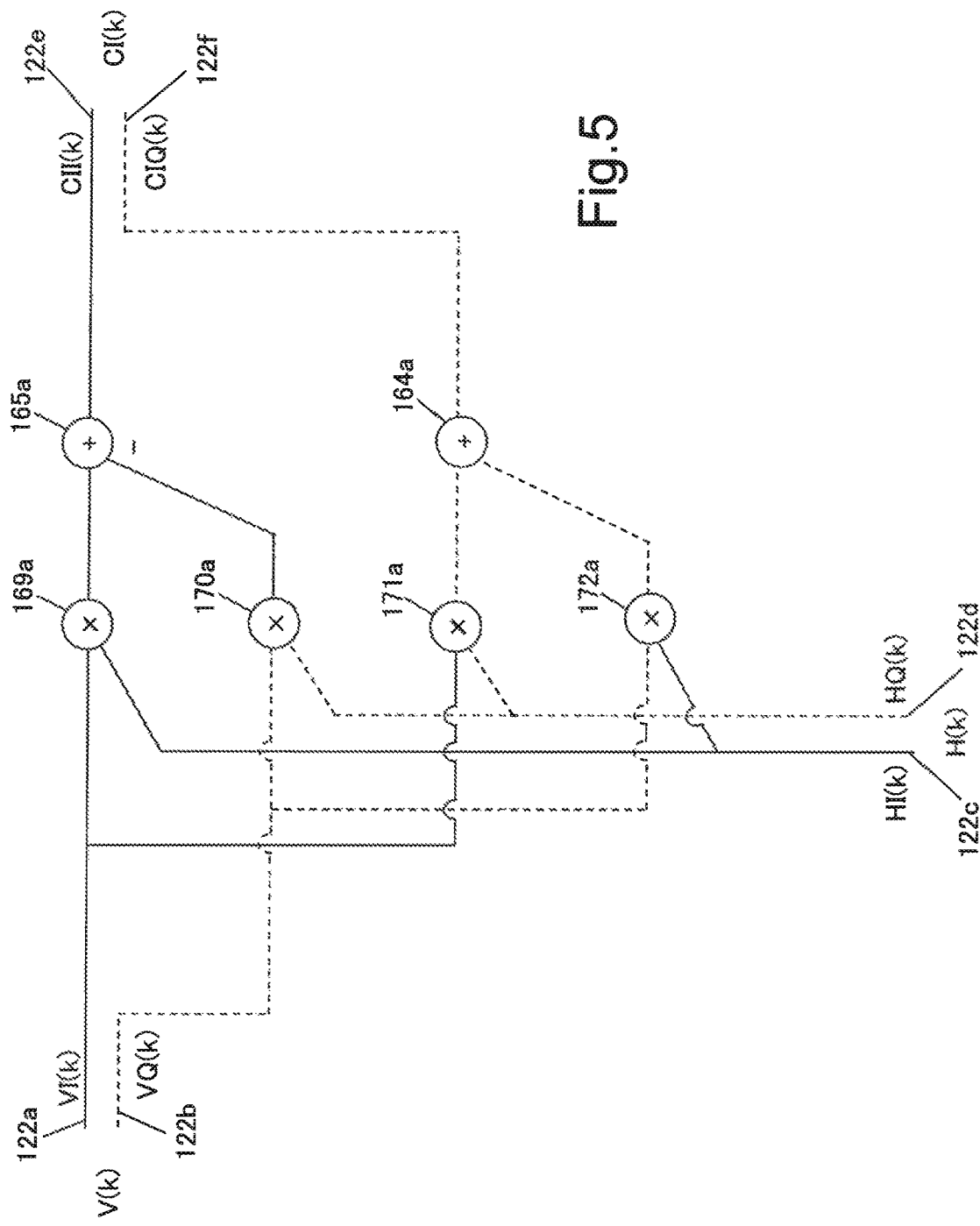
FIG. 5 is a conceptual diagram illustrating a configuration example of a first filter coefficient generation circuit.

FIG. 5 is a conceptual diagram illustrating a configuration example of the filter coefficient generation circuit 41 being a first filter coefficient generation circuit. Among lines indicating signal paths illustrated in FIG. 5, solid lines indicate signal paths of real parts of signals, and dotted lines indicate signal paths of imaginary parts of the signals.

The filter coefficient generation circuit 41 includes multiplication circuits 169a to 172a, an adder circuit 164a, and a subtraction circuit 165a.

Complex coefficients V(k) and H(k) are input to the filter coefficient generation circuit 41. Herein, the complex coefficients V(k) and H(k) are the complex coefficients V(k) and H(k) to be input to the filter coefficient generation circuit 41, which has been described with reference to FIG. 1.

A real part VI(k) of the complex coefficient V(k) input to the filter coefficient generation circuit 41 is input to a terminal 122a.

An imaginary part VQ(k) of the complex coefficient V(k) input to the filter coefficient generation circuit 41 is input to a terminal 122b.

A real part HI(k) of the complex coefficient H(k) input to the filter coefficient generation circuit 41 is input to a terminal 122c.

An imaginary part HQ(k) of the complex coefficient H(k) input to the filter coefficient generation circuit 41 is input to a terminal 122d.

When the complex coefficient V(k) to be input to the filter coefficient generation circuit 41 is input through one signal line, the filter coefficient generation circuit 41 includes an unillustrated separation circuit for separating the complex coefficient V(k). The separation circuit separates, from the complex coefficient V(k), the real part VI(k) of the complex coefficient V(k) and the imaginary part VQ(k) of the complex coefficient V(k). Further, the separation circuit inputs the real part VI(k) of the complex coefficient V(k) to the terminal 122a, and inputs the imaginary part VQ(k) of the complex coefficient V(k) to the terminal 122b.

Further, when the complex coefficient H(k) to be transmitted to the filter coefficient generation circuit 41 is input through one signal line, the filter coefficient generation circuit 41 includes an unillustrated separation circuit for separating the complex coefficient H(k). The separation circuit separates, from the complex coefficient H(k), the real part HI(k) of the complex coefficient H(k) and the imaginary part HQ(k) of the complex coefficient H(k). Further, the separation circuit outputs the real part HI(k) of the complex coefficient H(k) to the terminal 122c, and outputs the imaginary part HQ(k) of the complex coefficient H(k) to the terminal 122d.

The real part VI(k) of the complex coefficient V(k) input to the terminal 122a is transmitted to the multiplication circuit 169a and the multiplication circuit 171a.

The imaginary part VQ(k) of the complex coefficient V(k) input to the terminal 122b is transmitted to the multiplication circuit 170a and the multiplication circuit 172a.

The real part HI(k) of the complex coefficient H(k) input to the terminal 122c is transmitted to the multiplication circuit 169a and the multiplication circuit 172a.

The imaginary part HQ(k) of the complex coefficient H(k) input to the terminal 122d is transmitted to the multiplication circuit 171a and the multiplication circuit 172a.

The multiplication circuit 169a multiplies the real part VI(k) of the complex coefficient V(k) transmitted from the terminal 122a by the real part HI(k) of the complex coefficient H(k) transmitted from the terminal 122c. Then, the multiplication circuit 169a transmits a real part VI(k)×HI(k) being the multiplication result to the subtraction circuit 165a.

The multiplication circuit 170a multiplies the imaginary part VQ(k) of the complex coefficient V(k) transmitted from the terminal 122b by the imaginary part HQ(k) of the complex coefficient H(k) transmitted from the terminal 122d. Then, the multiplication circuit 170a transmits a real part VQ(k)×HQ(k) being the multiplication result to the subtraction circuit 165a.

The subtraction circuit 165a subtracts the real part VQ(k)×HQ(k) transmitted to the subtraction circuit 165a by the multiplication circuit 170a, from the real part VI(k)×HI(k) transmitted to the subtraction circuit 165a by the multiplication circuit 169a. Then, the subtraction circuit 165a acquires a real part CII(k)=VI(k)×HI(k)−Q(k)×HQ(k) of the filter coefficient CI(k). The subtraction circuit 165a outputs the real part CII(k) of the filter coefficient CI(k) to a terminal 122e.

The multiplication circuit 171a multiplies the real part VI(k) of the complex coefficient V(k) transmitted from the terminal 122a by the imaginary part HQ(k) of the complex coefficient H(k) transmitted from the terminal 122d. Then, the multiplication circuit 171a transmits an imaginary part VI(k)×HQ(k) being the multiplication result to the adder circuit 164a.

The multiplication circuit 172a multiplies the imaginary part VQ(k) of the complex coefficient V(k) transmitted from the terminal 122b by the real part HI(k) of the complex coefficient H(k) transmitted from the terminal 122c. Then, the multiplication circuit 172a transmits an imaginary part VQ(k)×HI(k) being the multiplication result to the adder circuit 164a.

The adder circuit 164a adds the imaginary part VQ(k)×HI(k) transmitted to the adder circuit 164a by the multiplication circuit 171a, and the imaginary part VQ(k)×HI(k) transmitted to the adder circuit 164a by the multiplication circuit 172a. Then, the adder circuit 164a acquires an imaginary part CIQ(k)=VQ(k)×HQ(k) of the filter coefficient CI(k). The adder circuit 164a outputs the imaginary part CIQ(k) of the filter coefficient CI(k) to a terminal 122f.

The filter coefficient generation circuit 41 includes the filter coefficient CI(k) in the complex signal i45 illustrated in FIG. 1 and outputs the complex signal i45 to the filter circuit 21 illustrated in FIG. 1.

The filter coefficient generation circuit 41 may output, to the filter circuit 21, the real part CII(k) of the filter coefficient CI(k) and the imaginary part CIQ(k) of the filter coefficient CI(k) separately from the terminal 122e and the terminal 122f by including the real part CII(k) of the filter coefficient CI(k) and the imaginary part CIQ(k) of the filter coefficient CI(k) in the complex signal i45.

Alternatively, the filter coefficient generation circuit 41 may include an unillustrated combining circuit at a post stage of the terminal 122e and the terminal 122f. Further, the combining circuit may include a signal acquired by combining the real part CII(k) of the filter coefficient CI(k) and the imaginary part CIQ(k) of the filter coefficient CI(k) in the complex signal i45 illustrated in FIG. 1, and output the complex signal i45 to the filter circuit 21 illustrated in FIG. 1.

Figure 6:
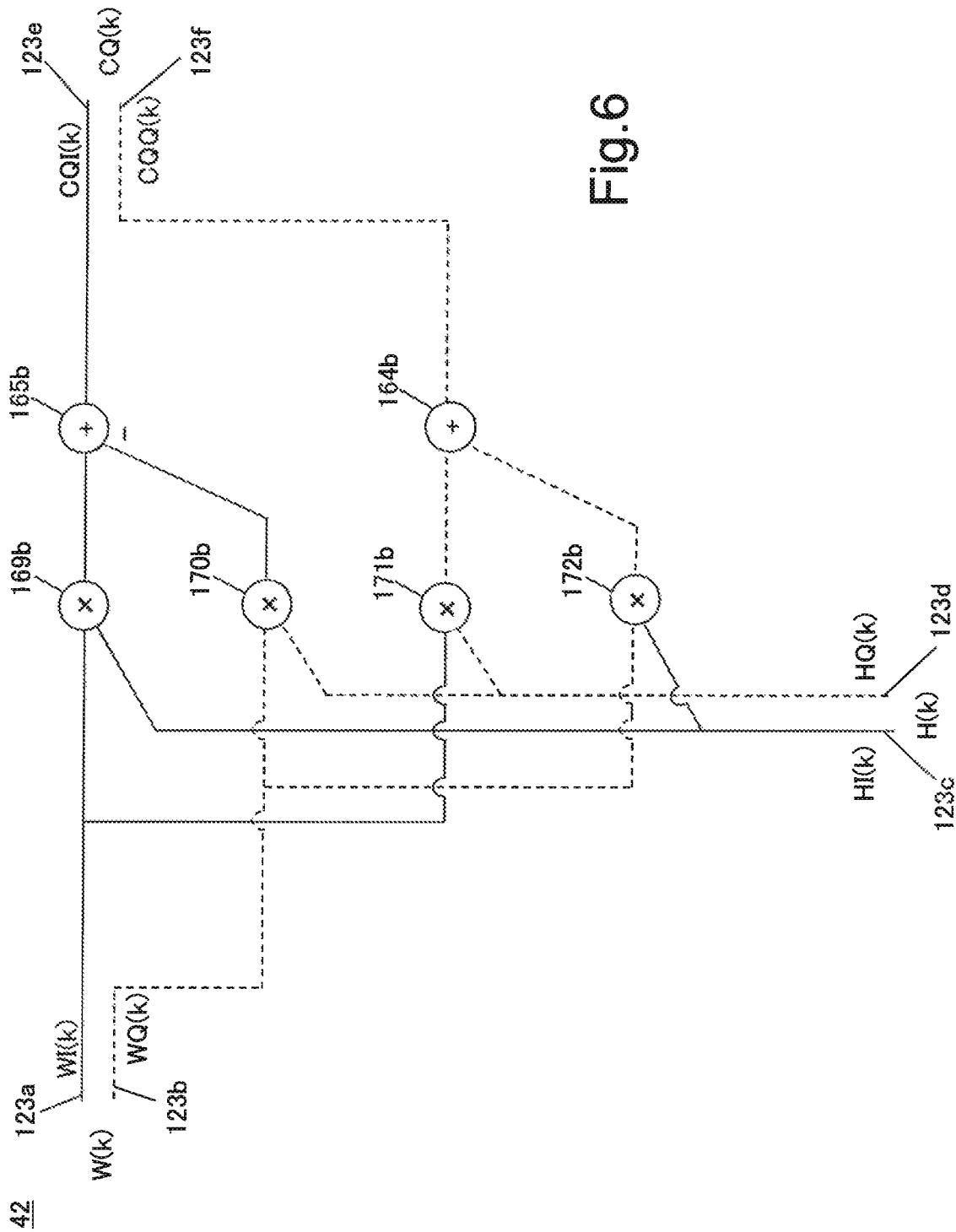
FIG. 6 is a conceptual diagram illustrating a configuration example of a second filter coefficient generation circuit.

FIG. 6 is a conceptual diagram illustrating a configuration example of the filter coefficient generation circuit 42 being a second filter coefficient generation circuit.

Description on a configuration of the filter coefficient generation circuit 42 illustrated in FIG. 6 is such that elements in the description on the filter coefficient generation circuit 41 described with reference to FIG. 5 are read as follows. Specifically, the filter coefficient generation circuit 41 is read as the filter coefficient generation circuit 42, and V(k) and CI(k) are respectively read as W(k) and CQ(k). Further, VI(k), VQ(k), CII(k), and CIQ(k) are read as WI(k), WQ(k), CQI(k), and CQQ(k), respectively. Further, the terminals 122a, 122b, 122c, 122d, 122e, and 122f are read as terminals 123a, 123b, 123c, 123d, 123e, and 123f, respectively. Further, the multiplication circuits 169a, 170a, 171a, and 172a are read as multiplication circuits 169b, 170b, 171b, and 172b, respectively; the adder circuit 164a is read as an adder circuit 164b; and the subtraction circuit 165a is read as a subtraction circuit 165b. Further, the complex signal i45 is read as the complex signal i46.

Next, a specific example of a filter circuit according to the first example embodiment is described.

Figure 7:
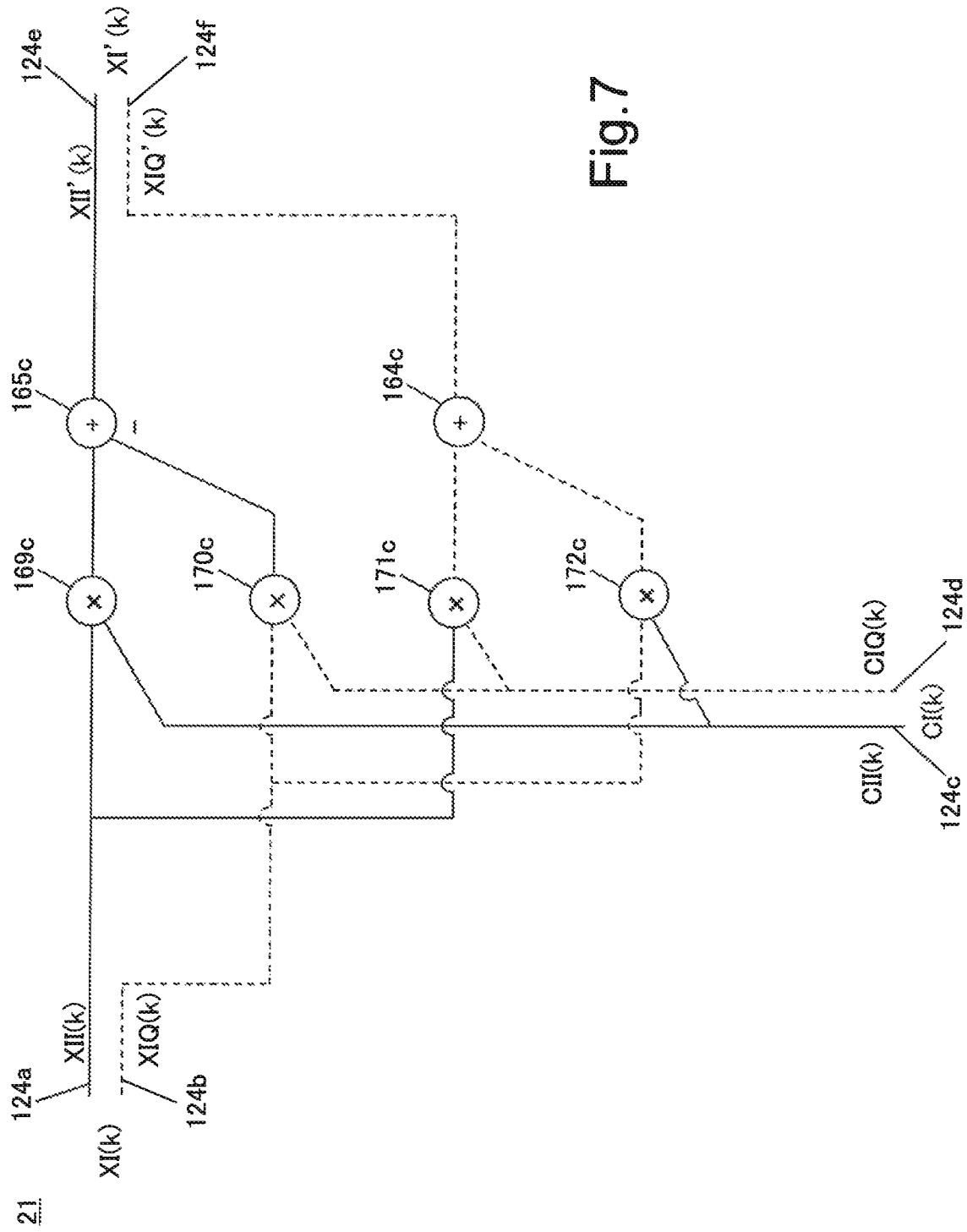
FIG. 7 is a conceptual diagram illustrating a configuration example of a first filter circuit.

FIG. 7 is a conceptual diagram illustrating a configuration example of the filter circuit 21 being a first filter circuit. Among lines indicating signal paths illustrated in FIG. 7, solid lines indicate signal paths of real parts of signals, and dotted lines indicate signal paths of imaginary parts of the signals.

The filter circuit 21 includes multiplication circuits 169c to 172c, an adder circuit 164c, and a subtraction circuit 165c.

The complex signal XI(k) and the filter coefficient CI(k) are input to the filter circuit 21. Herein, the complex signal XI(k) is the complex signal XI(k) to be output to the filter circuit 21 by the separation circuit 15, which is described with reference to FIG. 4. Further, the filter coefficient CI(k) is the filter coefficient CI(k) to be output to the filter circuit 21 by the filter coefficient generation circuit 41 illustrated in FIG. 1 and FIG. 5.

A real part XII(k) of the complex signal XI(k) input to the filter circuit 21 is input to a terminal 124a.

An imaginary part XIQ(k) of the complex signal XI(k) input to the filter circuit 21 is input to a terminal 124b.

The real part CII(k) of the filter coefficient CI(k) input to the filter circuit 21 is input to a terminal 124c.

The imaginary part CIQ(k) of the filter coefficient CI(k) input to the filter circuit 21 is input to a terminal 124d.

When the signal selection circuit 19 transmits the complex signal XI(k) to the filter circuit 21 through one signal line, the filter circuit 21 includes an unillustrated separation circuit for separating the complex signal XI(k). The separation circuit separates, from the complex signal XI(k), the real part XII(k) of the complex signal XI(k) and the imaginary part XIQ(k) of the complex signal XI(k). Then, the separation circuit outputs the real part XII(k) of the complex signal XI(K) to the terminal 124a, and outputs the imaginary part XIQ(k) of the complex signal XI(k) to the terminal 124b.

Further, when the filter coefficient generation circuit 41 transmits the filter coefficient CI(k) to the filter circuit 21 through one signal line, the filter circuit 21 includes an unillustrated separation circuit for separating the filter coefficient CI(k). The separation circuit separates, from the filter coefficient CI(k), the real part CII(k) of the filter coefficient CI(k) and the imaginary part CIQ(k) of the filter coefficient CI(k). Then, the separation circuit outputs the real part CII(k) of the filter coefficient CI(k) to the terminal 124c, and outputs the imaginary part CIQ(k) of the filter coefficient CI(k) to the terminal 124d.

The real part XII(k) of the complex signal XI(k) input to the terminal 124a is transmitted to the multiplication circuit 169c and the multiplication circuit 171c.

The imaginary part XIQ(k) of the complex signal XI(k) input to the terminal 124b is transmitted to the multiplication circuit 170c and the multiplication circuit 172c.

The real part CII(k) of the filter coefficient CI(k) input to the terminal 124c is transmitted to the multiplication circuit 169c and the multiplication circuit 172c.

The imaginary part CIQ(k) of the filter coefficient CI(k) input to the terminal 124d is transmitted to the multiplication circuit 171c and the multiplication circuit 170c.

The multiplication circuit 169c multiplies the real part XII(k) of the complex signal XI(k) transmitted from the terminal 124a by the real part CII(k) of the filter coefficient CI(k) transmitted from the terminal 124c. Then, the multiplication circuit 169c transmits a real part XII(k)×CII(k) being the multiplication result to the subtraction circuit 165c.

The multiplication circuit 170c multiplies the imaginary part XIQ(k) of the complex signal XI(k) transmitted from the terminal 124b by the imaginary part CIQ(k) of the filter coefficient CI(k) transmitted from the terminal 124d. Then, the multiplication circuit 170c transmits a real part XIQ(k)×CIQ(k) being the multiplication result to the subtraction circuit 165c.

The subtraction circuit 165c subtracts the real part XIQ(k)×CIQ(k) transmitted to the subtraction circuit 165c by the multiplication circuit 170c, from the real part XII(k)×CII(k) transmitted to the subtraction circuit 165c by the multiplication circuit 169c. Then, the subtraction circuit 165c acquires a real part XII'(k)=XII(k)×CII(k)−XIQ(k)×CIQ(k) of the complex signal XI'(k) after filter processing. The subtraction circuit 165c outputs the real part XII'(k) of the complex signal XI'(k) to a terminal 124e.

The multiplication circuit 171c multiplies the real part XII(k) of the complex signal XI(k) transmitted from the terminal 124a by the imaginary part CIQ(k) of the filter coefficient CI(k) transmitted from the terminal 124d. Then, the multiplication circuit 171c transmits an imaginary part XII(k)×CIQ(k) being the multiplication result to the adder circuit 164c.

The multiplication circuit 172c multiplies the imaginary part XIQ(k) of the complex signal XI(k) transmitted from the terminal 124b by the real part CII(k) of the filter coefficient CI(k) transmitted from the terminal 124c. Then, the multiplication circuit 172c transmits an imaginary part XIQ(k)×CII(k) being the multiplication result to the adder circuit 164c.

The adder circuit 164c adds the imaginary part XII(k)×CIQ(k) transmitted to the adder circuit 164c by the multiplication circuit 171c, and the imaginary part XIQ(k)×CII(k) transmitted from the multiplication circuit 172c. Then, the adder circuit 164c acquires an imaginary part XIQ'(k)=XIQ(k)×CII(k)+XII(k)×CIQ(k) of the complex signal XI'(k) after correction. The adder circuit 164c outputs the imaginary part XIQ'(k) of the complex signal XI'(k) to the terminal 124e.

The filter circuit 21 outputs the complex signal XI'(k) to the combining circuit 16 illustrated in FIG. 1, as the complex signal i34 illustrated in FIG. 1.

The filter circuit 21 may include the real part XII'(k) and the imaginary part XIQ'(k) in the complex signal i34 illustrated in FIG. 1, and output the real part XII'(k) and the imaginary part XIQ'(k) separately from the terminal 124e and a terminal 124f to the filter circuit 21, as the complex signal i34.

Alternatively, the filter circuit 21 may include an unillustrated combining circuit at a post stage of the terminal 124e and the terminal 124f. Further, the combining circuit may output, to the filter circuit 21 illustrated in FIG. 1, a signal acquired by combining the real part XII'(k) of the complex signal XI'(k) and the imaginary part XIQ'(k) of the complex signal XI'(k), as the complex signal i34 illustrated in FIG. 1.

Figure 8:
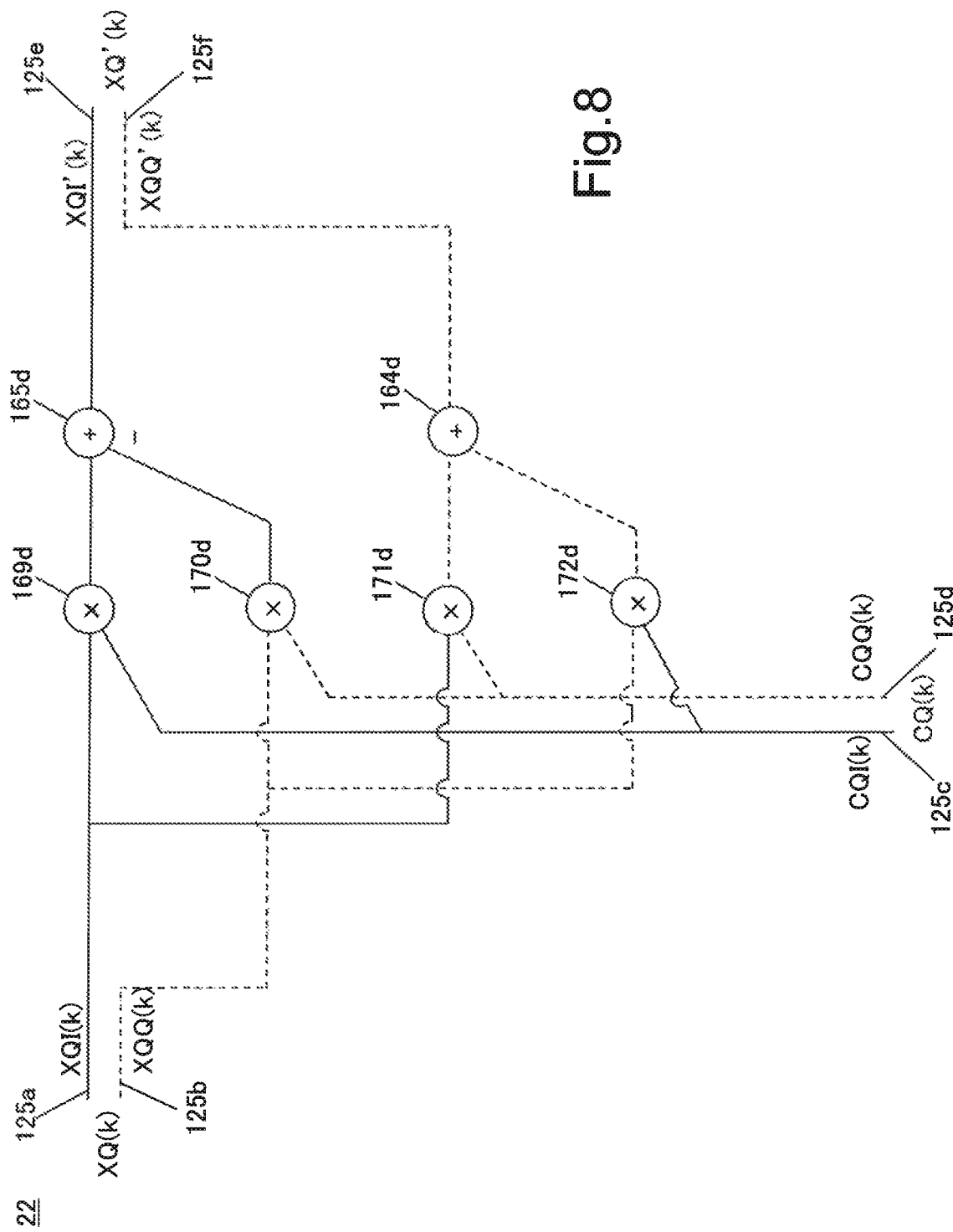
FIG. 8 is a conceptual diagram illustrating a configuration example of a second filter circuit.

FIG. 8 is a conceptual diagram illustrating a configuration example of the filter circuit 22 being a second filter circuit.

Description on a configuration of the filter circuit 22 illustrated in FIG. 8 is such that elements in the description on the filter circuit 21 described with reference to FIG. 7 are read as follows. Specifically, the filter circuit 21 is read as the filter circuit 22, and XI(k) and CI(k) are read as XQ(k) and CQ(k), respectively. Further, XII(k), XIQ(k), CII(k), and CIQ(k) are read as XQI(k), XQQ(k), CQI(k), and CQQ(k), respectively. Further, the terminals 124a, 124b, 124c, 124d, 124e, and 124f are read as terminals 125a, 125b, 125c, 125d, 125e, and 125f, respectively. Further, the multiplication circuits 169c, 170c, 171c, and 172c are read as multiplication circuits 169d, 170d, 171d, and 172d, respectively; the adder circuit 164c is read as an adder circuit 164d; and the subtraction circuit 165c is read as a subtraction circuit 165d. Further, the signals i32, i45, and i34 are read as the signals i33, i46, and i35, respectively. Further, FIG. 5 is read as FIG. 6.

Next, a specific example of the combining circuit 16 is described.

FIG. 9 is a conceptual diagram illustrating a configuration of the combining circuit 16 being an example of a combining circuit.

The combining circuit 16 includes adder circuits 175 and 176.

A real part XI'I(k) of a complex signal XI'(k) is input to a terminal 126a. The complex signal XI'(k) is the complex signal XI'(k) output to the combining circuit 16 by the filter circuit 21 described with reference to FIG. 7. The real part XI'I(k) of the complex signal XI'(k) is transmitted to the adder circuit 175.

An imaginary part XI'Q(k) of the complex signal XI'(k) is input to a terminal 126b. The imaginary part XI'Q(k) of the complex signal XI'(k) is transmitted to the adder circuit 176.

A real part XQ'I(k) of the complex signal XQ'(k) is input to a terminal 126c. The complex signal XQ'(k) is the complex signal XQ'(k) output to the combining circuit 16 by the filter circuit 22 described with reference to FIG. 8. The real part XQ'I(k) of the complex signal XQ'(k) is transmitted to the adder circuit 175.

An imaginary part XQ'Q(k) of the complex signal XQ'(k) is input to a terminal 126d. The imaginary part XQ'Q(k) of the complex signal XQ'(k) is transmitted to the adder circuit 176.

The adder circuit 175 adds the real part XI'I(k) of the complex signal XI'(k) and the real part XQ'I(k) of the complex signal XQ'(k), and acquires a real part XI''I(k)=XI'I(k)+XQ'I(k) of the complex signal X''(k) after IQ combining. The adder circuit 175 outputs the real part XI''I(k) of the complex signal X''(k) to a terminal 126e.

The adder circuit 176 adds the imaginary part XI'Q(k) of the complex signal XI'(k) and the imaginary part XQ'Q(k) of the complex signal XQ'(k), and acquires an imaginary part XI''Q(k)=XI'Q(k)+XQ'Q(k) of the complex signal X''(k) after IQ combining. The adder circuit 175 outputs the imaginary part XI''Q(k) of the complex signal X''(k) to a terminal 126f.

The complex signal X"(k) after IQ combining is output to the IFT circuit 14 illustrated in FIG. 1, as the signal i36 illustrated in FIG. 1, via the terminals 126e and 126f.

On that occasion, the combining circuit 16 may include the real part XI"I(k) of the complex signal X"(k) and the imaginary part XI"Q(k) of the complex signal X"(k) after IQ combining in the complex signal i36 illustrated in FIG. 1, and output the real part XI"I(k) of the complex signal X"(k) and the imaginary part XI"Q(k) of the complex signal X"(k) after IQ combining in the complex signal i36 separately to the IFT circuit 14 illustrated in FIG. 1.

Alternatively, the combining circuit 16 may include an unillustrated combining circuit at a post stage of the terminal 126e and the terminal 126f. Further, the combining circuit may output, to the IFT circuit 14 illustrated in FIG. 1, a signal acquired by combining the real part XI"I(k) of the complex signal X"(k) and the imaginary part XI'Q(k) of the complex signal X"(k) by including the signal acquired by combining the real part XI"I(k) of the complex signal X"(k) and the imaginary part XI'Q(k) of the complex signal X"(k) in the complex signal i36 illustrated in FIG. 1.

As described above, the digital filter circuit 10 illustrated in FIG. 1 performs FT on the complex signal x(n) in a time domain, and generates the complex signal X(k) in a frequency domain. Further, the digital filter circuit 10 performs filter processing on the real part R(k) of the complex signal X(k) and the imaginary part S(k) of the complex signal X(k) in a frequency domain. The digital filter circuit 10 performs the filter processing independently by using the two types of filter coefficients CI(k) and CQ(k) generated from the complex coefficients V(k), W(k), and H(k). Further, the digital filter circuit 10 transforms the complex signal X"(k) in a frequency domain after filter processing into the signal y(n) in a time domain by IFT. In this way, the digital filter circuit 10 performs FT and IFT each one time.

In the following, a physical meaning of the complex coefficients V(k), W(k), and H(k) described with reference to FIG. 5 and FIG. 6 is described. Further, in the following, principles based on which filter processing in a frequency domain equivalent to desired filter processing in a time domain is enabled by filter processing using the filter coefficients CI(k) and CQ(k) generated from the complex coefficients V(k), W(k), and H(k) are described.

First of all, description is made for a case where the selection signal i48 designates the first selection mode, and the digital filter circuit 10 performs filter processing based on the first selection mode.

In the present example embodiment, in the first selection mode, the separation circuit 15 generates XI(k) and XQ(k) from the complex signal X(k) in a frequency domain (see Eq. (2)), which is acquired by performing an FT operation on the complex signal in a time domain: x(n)=r(n)+js(n) (see Eq. (1)) to be input.

$$X(k)=R(k)+jS(k) \tag{14}$$

Herein, R(k) is a complex signal in a frequency domain, which is acquired by performing FT on a real part signal r(n) of a real number in a time domain, and S(k) is a complex signal in a frequency domain, which is acquired by performing FT on an imaginary signal s(n) of the real number in the time domain. In this case, the following equation is established from symmetry of a complex conjugate.

$$X^*(N-k)=R(k)-jS(k) \tag{15}$$

Herein, X*(N−k) denotes a complex conjugate of X(N−k).

From Eqs. (5), (6), (14), and (15), $$XI(k)=\{X(k)-X^*(N-k)\}/2=R(k) \tag{16}$$

$$XQ(k)=\{X(k)-X^*(N-k)\}/2j=S(k) \tag{17}$$

Further, from Eqs. (7), (9), and (16), $$\begin{aligned} XI'(k) &= XI(k) \times CI(k) \\ &= R(k) \times V(k) \times H(k) \end{aligned} \tag{18}$$

Further, from Eqs. (8), (10), and (17), $$\begin{aligned} XQ'(k) &= XQ(k) \times CQ(k) \\ &= jS(k) \times W(k) \times H(k) \end{aligned} \tag{19}$$

When Eqs. (18) and (19) are substituted in Eq. (13), $$\begin{aligned} X''(k) &= XI'(k) + XQ'(k) \\ &= R(k)V(k)H(k) + jS(k)W(k)H(k) \\ &= \{R(k)V(k) + jS(k)W(k)\} \times H(k) \end{aligned} \tag{20}$$

Eq. (20) expresses the signal X"(k) before IFT by using the complex coefficients V(k), W(k), and H(k), and the real part R(k) and the imaginary part S(k) of the signal X(k) after FT but before filter processing. In other words, Eq. (20) expresses a content of filter processing to be performed on the signal X(k) after FT but before filter processing. It is clear, from Eq. (20), that the digital filter circuit 10 performs processing equivalent to the following three filter processing on a complex signal in a frequency domain: X(k)=R(k)+jS(k) (see Eq. (14)), which is generated by performing FT on a complex signal in a time domain: x(n)=r(n)+js(n).

(1) Filter Processing on Complex Signal R(k) by Complex Coefficient V(k)

First of all, the digital filter circuit 10 performs filter processing by the complex coefficient V(k) on the complex signal R(k) in a frequency domain, which is acquired by performing FT on the real part signal r(n) in a time domain. A complex filter coefficient in a frequency domain, which is associated with a real filter coefficient when filter processing by real number operation in a time domain is performed on the real number signal r(n), is allocated to the complex coefficient V(k).

(2) Filter Processing on S(k) by Complex Coefficient W(k)

The digital filter circuit 10 performs filter processing by the complex coefficient W(k) on the complex signal S(k) in a frequency domain, which is acquired by performing FT on an imaginary part signal s(n) in a time domain. A complex filter coefficient in a frequency domain, which is associated with a real filter coefficient when filter processing by real number operation in a time domain is performed on the imaginary part signal s(n), is allocated to the complex coefficient W(k).

(3) Filter Processing by Coefficient H(k) on Signal after Filter Processing Described in Filter Processing (1) and (2)

The digital filter circuit 10 performs filter processing by the complex coefficient H(k) on a complex signal R(k)V(k)+jS(k)W(k) constituted by a real part R(k)V(k) and an imaginary part S(k)W(k) after filter processing.

The complex signal R(k)V(k)+jS(k)W(k) is a complex signal in a frequency domain, which is associated with a signal in a time domain constituted by two signals acquired by performing filter processing independently on the real part signal r(n) and the imaginary part signal s(n) in a time domain. Signals acquired by performing filter processing independently on the real part signal r(n) and the imaginary part signal s(n) correspond to signals subjected to filter processing in a time domain. In this way, the complex signal R(k)V(k)+jS(k)W(k) is a signal in a frequency domain, which is associated with signals in a time domain acquired by performing filter processing independently on a real part and an imaginary part in a time domain.

Therefore, the following coefficient may be used in order to perform processing equivalent to filter processing by complex computation on a complex signal in a time domain, with respect to the complex signal R(k)V(k)+jS(k)W(k) in a frequency domain. Specifically, a complex filter coefficient in a frequency domain, which is associated with a complex filter coefficient when filter processing by complex computation in a time domain is performed on the complex signal x(n), may be allocated as the complex coefficient H(k).

As described above, in the present example embodiment, an external unit sets three types of complex coefficients V(k), W(k), and H(k). Specifically, an external unit sets the complex coefficients V(k) and W(k) in a frequency domain, which are associated with filter coefficients in a time domain with respect to a real part and an imaginary part of the complex signal x(n), respectively, and the coefficient H(k) in a frequency domain, which is associated with a filter coefficient in a time domain with respect to x(n). By performing filter processing using the two filter coefficients CI(k) and CQ(k) acquired from the three complex coefficients V(k), W(k), and H(k), it is possible to configure that FT before filter processing and IFT after filter processing are performed only one time each.

Next, a case where the selection signal i48 designates the second selection mode, and the digital filter circuit 10 performs filter processing based on the second selection mode is described.

In the present example embodiment, in the second selection mode, the separation circuit 15 generates the complex signals XI(k) and XQ(k) from the complex signal in a frequency domain: X(k)=R(k)+jS(k) (see Eq. (14)), which is acquired by performing a complex FT operation on a complex signal in a time domain: x(n)=r(n)+js(n) (see Eq. (1)).

From Eqs. (5'), (6'), and (14), the complex signals XI(k) and XQ(k) are expressed as follows.

$$XI(k) = X(k) = R(k) + jS(k) \quad (16')$$

$$XQ(k) = 0 \quad (17')$$

Further, from Eqs. (7), (9), and (16'), $$XI'(k) = XI(k) \times CI(k) \quad (18')$$
$$= \{R(k) + jS(k)\} \times V(k) \times H(k)$$

Further, from Eqs. (8), (10), and (17'), the complex signal XQ'(k) is expressed as follows.

$$XQ'(k) = XQ(k) \times CQ(k) = 0 \quad (19')$$

When Eq. (18') and (19') are substituted in Eq. (13), the complex signal X"(k) is expressed as follows.

$$X''(k) = XI'(k) + XQ'(k) \quad (20')$$
$$= \{R(k) + jS(k)\} \times V(k) \times H(k) + 0$$
$$= \{R(k)V(k) + jS(k)V(k)\} \times H(k)$$

Herein, comparison is made between Eq. (20) and Eq. (20'). Then, it is clear that Eq. (20) and Eq. (20') coincide with each other, when the complex coefficients V(k) and W(k) are equal to each other (V(k)=W(k)). Specifically, when the complex signals V(k) and W(k) are equal to each other, the digital filter circuit 10 performs equivalent filter processing both in the first selection mode and the second selection mode.

In the second selection mode, the separation circuit 15 constantly outputs a value 0 to the Q component signal XQ(k). The filter circuit 22 constantly outputs a value 0 from the separation circuit 15 as the Q component signal XQ(k), and constantly outputs a value 0 to a complex signal 35 as a result of complex multiplication by the value 0. Therefore, in the second selection mode, a value of a signal serving as a target for filter processing to be performed by the filter circuit 22 is zero. On the other hand, in the first selection mode, a signal serving as a target for filter processing to be performed by the filter circuit 22 is the Q component signal XQ(k) expressed by Eq. (6). The signal of a value 0 has a small change in value of a signal, as compared with the Q component signal XQ(k) expressed by Eq. (6). Specifically, filter processing in the second selection mode has a small change in value of a signal serving as a target for filter processing to be performed by the filter circuit 22, as compared with the first selection mode. Therefore, when the multiplication circuits 169d to 172d, the adder circuit 164d, and the subtraction circuit 165d being logic elements constituting the filter circuit 22 perform operations, current flowing into these logic elements or current flowing out from these logic elements is small. Thus, since power consumed by resistance or capacitance of wire connecting between the multiplication circuits 169d to 172d, the adder circuit 164d, and the subtraction circuit 165d is reduced, power consumption is reduced.

On the other hand, in the second selection mode, the filter circuit 21 performs filter processing on the complex signal: X(k)=R(k)+jS(k) expressed by Eq. (14). On the other hand, in the first mode, filter processing is performed on the I component signal XI(k) expressed by Eq. (5). Herein, it is empirically clear that a difference in power consumption is small between filter processing of the complex signal: X(k)=R(k)+jS(k) and filter processing on the I component signal XI(k) expressed by Eq. (5).

As described above, power consumption required for filter processing is small in filter processing by the second operation mode, as compared with filter processing in the first operation mode.

When independent filter processing on the real part signal r(n) and the imaginary part signal s(n) in a time domain is not performed, the complex coefficients V(k) and W(k) are equal to each other. Therefore, in the digital filter circuit 10, filter processing in the first selection mode and filter processing in the second selection mode become filter processing equivalent to each other. Thus, in the digital filter circuit 10, by performing filter processing in the second selection mode, power consumption consumed by the digital filter circuit 10 when equivalent filter processing is performed is reduced.

As described above, an external unit such as a host circuit inputs the selection signal i48 to the digital circuit 10, in other words, an external unit sets a selection mode. When the complex coefficients V(k) and W(k) are set, in a case where the complex coefficients V(k) and W(k) are different values, the external unit includes a signal designating the first selection mode in the selection signal i48. Further, in a case where the complex coefficients V(k) and W(k) are different values, the external unit includes a signal designating the second selection mode in the selection signal i48. By switching a content of the selection signal i48 to be output to the digital filter circuit 10 by the external unit, the digital filter circuit 10 is able to reduce power consumption consumed by the digital filter circuit 10.

[Advantageous Effects]

The digital filter in the present example embodiment performs different filter processing, based on one of the first selection mode and the second selection mode, which is output to the digital filter according to the present example embodiment by an external unit. Filter processing in the first and second selection modes is independent filter processing by real number operation on each of a real part and an imaginary part of a complex signal. Further, as described above, the filter processing in the second selection mode requires smaller power consumption, because a change in value of a signal is small in filter processing in the second selection mode, as compared with filter processing in the first selection mode. Therefore, by selecting the second selection mode as necessary, it is possible to reduce power consumption for performing filter processing. Reducing power consumption for filter processing enables to reduce an amount of heat generated when filter processing is performed.

Specifically, the digital filter circuit according to the first example embodiment is able to increase a possibility capable of reducing power consumption required for filter processing, and an amount of heat generated when filter processing is performed.

Further, in the digital filter according to the present example embodiment, the complex coefficient V(k) for use in filter processing on a real part of a complex signal is included only in the filter coefficient CI(k). Further, the complex coefficient Q(k) for use in filter processing on an imaginary part of a complex signal is included only in CQ(k). Therefore, when only one of the complex coefficient V(k) with respect to a real part and the complex coefficient W(k) with respect to an imaginary part is changed, it is sufficient to change either one of the two integrated filter coefficients CI(k) and CQ(k). When a filtering effect of a digital filter is observed by changing the complex coefficients V(k) and W(k), there is a case that a filtering effect is observed by changing the filter coefficients CI(k) and CQ(k), instead of changing the complex coefficients V(k) and W(k). The filter coefficient CI(k) to be used by the digital filter according to the present example embodiment depends on the complex coefficient V(k), but does not depend on the complex coefficient W(k). Further, the filter coefficient CQ(k) to be used by the digital filter according to the present example embodiment depends on the complex coefficient W(k), but does not depend on the complex coefficient V(k). Therefore, it is easier to change the filter coefficients CI(k) and CQ(k) when a filtering effect is observed by changing the filter coefficients CI(k) and CQ(k) and changing only one of the complex coefficients V(k) and W(k). The easiness is easiness when comparison is made with respect to the filter coefficient acquired by the method disclosed in PTL 1, which is described in the section "Background Art".

Second Example Embodiment

The second example embodiment is an example embodiment relating to a digital filter circuit including a selection generation circuit for generating a selection signal to be output to a separation circuit.

FIG. 10 is a conceptual diagram illustrating a configuration of a digital filter circuit 10a being an example of a digital filter circuit according to the second example embodiment.

The digital filter circuit 10a includes a selection signal generation circuit 49, in addition to the respective configurations included in the digital filter circuit 10 illustrated in FIG. 1.

Complex coefficients V(k) and W(k) are output to the selection signal generation circuit 49. The output is performed by a part constituting a host circuit of the digital filter circuit 10a, for example.

The selection signal generation circuit 49 determines whether or not the complex coefficients V(k) and W(k) output to the selection signal generation circuit 49 are equal to each other.

Further, when the selection signal generation circuit 49 does not determine that the complex coefficients V(k) and W(k) output to the digital filter circuit 10a by the external unit are equal to each other, the selection signal generation circuit 49 outputs, to a separation circuit 15, a selection signal i48b including designation of a first selection mode.

On the other hand, when the selection signal generation circuit 49 determines that the complex coefficients V(k) and W(k) output to the digital filter circuit 10a by the external unit are equal to each other, the selection signal generation circuit 49 outputs, to the separation circuit 15, a selection signal i48 including designation of a second selection mode.

Description on the respective configurations of the digital filter circuit 10a illustrated in FIG. 10 is the same as description on the respective configurations of the digital filter circuit 10 illustrated in FIG. 1, except for the above. However, when the above description, and description on the respective configurations of the digital filter circuit 10 illustrated in FIG. 1 are contradictory, the above description is preferentially used.

[Advantageous Effects]

The digital filter circuit 10a according to the second example embodiment provides, first of all, the same advantageous effects as the digital filter circuit 10 described in the first example embodiment.

The digital filter circuit 10a according to the second example embodiment automatically selects a selection mode 2, when the complex coefficients V(k) and W(k) are equal to each other, in addition to the aforementioned advantageous effects. Further, when the selection mode 2 is selected, the digital filter circuit 10a is able to reduce power consumption required for filter processing, and an amount of heat generated during filter processing.

Note that FIG. 11 is a conceptual diagram illustrating a digital filter 10x being a minimum configuration of a digital filter according to the present invention.

The digital filter 10x includes a separation unit 15X, a signal selection unit 19X, a first filter unit 21X, a second filter unit 22X, and a combining unit 16X.

The separation unit 15X generates, from a first complex signal in a frequency domain output to the separation unit 15X, a second complex signal and a third complex signal being a complex conjugate of the second complex signal. The separation unit 15X outputs the second complex signal and the third complex signal to the signal selection unit 19X.

The signal selection unit 19X switches a complex signal to be output to the first filter unit 21X by the signal selection unit 19X by using the second complex signal and the third complex signal output to the signal selection unit 19X by the separation unit 15X. The complex signal to be switched is at least one of a fourth complex signal, and a fifth complex signal to be output to the second filter unit 22X. The signal selection unit 19X performs the switching by selecting from among a plurality of types of complex signals having different amounts of change in signal amplitude by the signal selection unit 19X.

The first filter unit performs filter processing on the fourth complex signal by a first filter coefficient, and generates a sixth complex signal. The first filter unit outputs the sixth complex signal to the combining unit 16X.

The second filter unit 22X performs processing on the fifth complex signal by a second filter coefficient, and generates a seventh complex signal. The second filter unit 22X outputs the seventh complex signal to the combining unit 16X.

The combining unit 16X combines the sixth complex signal and the seventh complex signal, and generates and outputs an eighth complex signal being a complex signal after combining.

The digital filter 10x provides the advantageous effects described in the section [Advantageous Effects of Invention] by the aforementioned configuration.

In the example embodiments described above, it is assumed that all respective processing such as FT, IFT, generation and combination of conjugate complexes, selection of a signal, calculation of a filter coefficient, and filter processing is performed by constituent elements such as individual circuits. However, the respective processing in the present invention may not be performed by constituent elements such as individual circuits, but may be executed by a computer included in a predetermined device, for example, software using a digital signal processor (DSP) and the like.

Note that calculation of a filter coefficient may be performed in advance by a separate program. Further, individual processing such as FFT and IFFT may be performed by another processor, or the like.

The filter processing program may be stored in a non-transitory medium. The medium may be, for example, a read only memory (ROM), a random access memory (RAM), a semiconductor storage device such as a flash memory, an optical disc, a magnetic disk, or a magneto-optical disk.

Further, a part of processing may be performed by hardware, and other processing may be performed by software. For example, FT and IFT may be processed by using an FT circuit and an IFT circuit, respectively, and other processing may be performed by software. Sharing of processing by hardware and processing by software may be optional.

The whole or part of the example embodiments disclosed above can be described as, but not limited to, the following supplementary notes.

(Supplementary Note A1)

A digital filter including:

a separation unit for generating, from a first complex signal in a frequency domain, a second complex signal and a third complex signal being a complex conjugate of the second complex signal, and outputting the second complex signal and the third complex signal;

a signal selection unit for performing switching by selecting, from among a plurality of types of complex signals having different amounts of change in signal amplitude, at least one of a fourth complex signal to be output to a first filter unit and a fifth complex signal to be output to a second filter unit, by using the second complex signal and the third complex signal;

a first filter unit for performing filter processing on the fourth complex signal by a first filter coefficient, and outputting a sixth complex signal;

a second filter unit for performing processing on the fifth complex signal by a second filter coefficient, and outputting a seventh complex signal; and a combining unit for combining the sixth complex signal and the seventh complex signal, and generating and outputting an eighth complex signal being a complex signal after combining.

(Supplementary Note A2)

The digital filter according to supplementary note A1, wherein a signal selection circuit sets signals selected from among the first complex signal, the second complex signal, the third complex signal, and a signal of a fixed value which are output to the signal selection circuit, as the fourth complex signal and the fifth complex signal.

(Supplementary Note A2.1)

The digital filter according to supplementary note A2, wherein the fixed value is a fixed value of a value zero.

(Supplementary Note A3)

The digital filter according to supplementary note A1 or A2, wherein the selection is selection from a first combination of the second complex signal to be output to the first filter unit and the third complex signal to be output to the second filter unit, and a second combination of the first complex signal to be output to the first filter unit and a signal indicating a value zero to be output to the second filter unit.

(Supplementary Note A4)

The digital filter according to supplementary note A3, wherein designation of the first mode and designation of the second mode are performed by a selection signal to be transmitted to the signal selection circuit.

(Supplementary Note A5)

The digital filter according to any one of supplementary notes A1 to A4, further including a filter coefficient generation unit for generating the first filter coefficient and the second filter coefficient.

(Supplementary Note A6)

The digital filter according to supplementary note A5, wherein the filter coefficient generation unit includes a first filter coefficient generation unit for generating the first filter coefficient, and a second filter coefficient generation unit for generating the second filter coefficient.

(Supplementary Note A7)

The digital filter according to supplementary note A6, wherein the first filter coefficient generation unit generates the first filter coefficient from a first complex coefficient and a third complex coefficient, and the second filter coefficient generation unit generates the second filter coefficient from a second complex coefficient and a third complex coefficient.

(Supplementary Note A7.1)

The digital filter according to supplementary note A7, wherein the first filter coefficient generation unit generates the first filter coefficient by complex-multiplying the first complex coefficient by the third complex coefficient, and the second filter coefficient generation unit generates the second filter coefficient by complex-multiplying the second complex coefficient by the second complex coefficient.

(Supplementary Note A7.2)

The digital filter according to supplementary note A7 or A7.1, wherein the first complex coefficient is a complex filter coefficient in a frequency domain, which is associated with a filter coefficient with respect to a real part of a complex signal in a time domain, in time-domain filter processing being filter processing in a time domain with respect to a time-domain complex signal being the complex signal in a time domain associated with the first complex signal, the second complex coefficient is a complex filter coefficient in a frequency domain, which is associated with a filter coefficient with respect to an imaginary part of the time-domain complex signal in the time-domain filter processing, and the third frequency-domain filter coefficient is a complex filter coefficient in a frequency domain, which is associated with a filter coefficient with respect to the time-domain complex signal in the time-domain filter processing.

(Supplementary Note A8)

The digital filter according to supplementary note A7, wherein selection of the first combination is performed when the first complex coefficient is not equal to the second complex coefficient, and selection of the second combination is performed when the first complex coefficient is equal to the second complex coefficient.

(Supplementary Note A9)

The digital filter according to any one of supplementary notes A4, and 5 to A8 (limited to a portion citing supplementary note 4), further including a selection signal generation unit for generating the selection signal, and outputting the selection signal generated by the selection signal generation unit to the separation unit.

(Supplementary Note A10)

The digital filter according to supplementary note A9 (limited to a portion citing supplementary note A7), wherein, when a content corresponding to the second complex coefficient output to the selection signal generation unit being equal to the third complex coefficient output to the selection signal generation unit is determined, the selection signal including a content corresponding to the second combination is generated.

(Supplementary Note A11)

The digital filter according to supplementary note A9 or A10 (limited to a portion citing supplementary note A7), wherein, when a content corresponding to the second complex coefficient output to the selection signal generation unit being equal to the third complex coefficient output to the selection signal generation unit is not determined, the selection signal including a content corresponding to the first combination is generated.

(Supplementary Note A12)

The digital filter according to any one of supplementary notes A1 to A11, wherein the first complex signal is a complex signal acquired by performing transform on a complex signal in a time domain into a complex signal in a frequency domain.

(Supplementary Note A13)

The digital filter according to supplementary note 12, wherein the transform is Fourier transform.

(Supplementary Note A14)

The digital filter according to supplementary note 13, wherein the Fourier transform is fast Fourier transform.

(Supplementary Note A15)

The digital filter according to any one of supplementary notes 12 to 14, further including a transform unit for performing the transform.

(Supplementary Note A16)

The digital filter according to supplementary note A15, further including an inverse transform unit for transforming the eighth complex signal into a complex signal in a time domain.

(Supplementary Note A17)

The digital filter according to any one of supplementary notes 12 to 16, wherein, when it is assumed that N is a transform sample number being a transform sample number for use in transforming into the complex signal in a frequency domain and being a positive integer, and k is a frequency number, the separation unit includes:

a complex conjugate $X^*(N-k)$ generation unit for generating a complex conjugate $X^*(N-k)$ being a complex conjugate of an output $X(N-k)$ being an output of the transform unit;

a first adder unit for adding a real part of an output $X(k)$ being an output of the transform unit and a real part of the complex conjugate $X^*(N-k)$;

a second adder unit for adding an imaginary part of the output $X(k)$ and an imaginary part of the complex conjugate $X^*(N-k)$;

a first subtraction unit for subtracting a real part of the complex conjugate $X^*(N-k)$ from a real part of an output $X(k)$ of the transform unit;

a second subtraction unit for subtracting an imaginary part of the complex conjugate $X^*(N-k)$ from an imaginary part of the output $X(k)$;

a first multiplication unit for multiplying an output of the first adder unit by a predetermined coefficient $1/2$;

a second multiplication unit for multiplying an output of the first subtraction unit by a predetermined coefficient $1/2$;

a third multiplication unit for multiplying an output of the second subtraction unit by a predetermined coefficient $1/2$;

a fourth multiplication unit for multiplying an output of the second adder unit by a predetermined coefficient $1/2$; and the signal selection unit for selecting the output $X(k)$ or one of outputs of the first and second multiplication units, and selecting one of outputs of the third and fourth multiplication units or a complex signal constantly having a value zero.

(Supplementary Note A18)

The digital filter according to any one of supplementary notes A1 to A17, wherein the combining unit generates the eighth complex signal by complex-adding complex data of a frequency number k included in the sixth complex signal, and complex data of a frequency number (N−k) included in the seventh complex signal regarding each frequency number k being a frequency number of not smaller than 0 but not larger than N−1.

(Supplementary Note B1)

A filter processing method including:

generating, from a first complex signal in a frequency domain output to a separation unit, a second complex signal and a third complex signal being a complex conjugate of the second complex signal;

performing switching by selecting, from among a plurality of types of complex signals having different amounts of change in signal amplitude, at least one of a fourth complex signal and a fifth complex signal, by using the second complex signal and the third complex signal which are output to a signal selection unit by the separation unit;

performing filter processing on the fourth complex signal by a first filter coefficient, and generating a sixth complex signal;

performing processing on the fifth complex signal by a second filter coefficient, and generating a seventh complex signal; and combining the sixth complex signal and the seventh complex signal.

(Supplementary Note C1)

A filter processing program causing a computer to execute processing including:

processing of generating, from a first complex signal in a frequency domain, a second complex signal and a third complex signal being a complex conjugate of the second complex signal;

processing of performing switching by selecting, from among a plurality of types of complex signals having different amounts of change in signal amplitude, at least one of a fourth complex signal and a fifth complex signal, by using the second complex signal and the third complex signal;

processing of performing filter processing on the fourth complex signal by a first filter coefficient, and acquiring a sixth complex signal;

processing of performing filter processing on the fifth complex signal by a second filter coefficient, and acquiring a seventh complex signal; and processing of combining the sixth complex signal and the seventh complex signal.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent applications No. 2015-235786 filed on Dec. 2, 2015, the disclosure of which is incorporated herein in its entirety by reference.

REFERENCE SIGNS LIST

10 Digital filter circuit
13 FT circuit
14 IFT circuit
15 Separation circuit
15X Separation unit
16 Combining circuit
16X Combining unit
21, 22 Filter circuit
21X, 22X Filter unit
41, 42 Filter coefficient generation circuit
49 Selection signal generation circuit
51, 52 Signal selection circuit
i31, i32, i33, i34, i35, i36, i145, i46 Complex signal
i48 Selection signal
121a, 121b, 121c, 121d, 121e, 121f, 121g, 121h, 122a, 122b, 122c, 122d, 122e, 122f, 123a, 123b, 123c, 123d, 123e, 123f, 124a, 124b, 124c, 124d, 124e, 124f, 125a, 125b, 125c, 125d, 125e, 125f, 126a, 126b, 126c, 126d, 126e, 126f Terminal
150, 151, 164a, 164b, 164c, 164d, 175, 176 Adder circuit
152, 153, 165a, 165b, 165c, 165d Subtraction circuit
154, 155, 156, 157, 158, 169a, 169b, 169c, 169d, 170a, 170b, 170c, 170d, 171a, 171b, 171c, 171d, 172a, 172b, 172c, 172d Multiplication circuit

What is claimed is:

1. A digital filter including:
a separation circuit for generating, from a first complex signal in a frequency domain, a second complex signal and a third complex signal being a complex conjugate of the second complex signal, and outputting the second complex signal and the third complex signal;
a signal selection circuit for performing switching by selecting, from among a plurality of types of complex signals having different amounts of change in signal amplitude, at least one of a fourth complex signal to be output to a first filter and a fifth complex signal to be output to a second filter, by using the second complex signal and the third complex signal;
the first filter for performing filter processing on the fourth complex signal by a first filter coefficient, and outputting a sixth complex signal;
the second filter for performing processing on the fifth complex signal by a second filter coefficient, and outputting a seventh complex signal; and
a combining circuit for combining the sixth complex signal and the seventh complex signal, and generating and outputting an eighth complex signal being a complex signal after the combining.

2. The digital filter according to claim 1, wherein
the selecting is selecting from a first combination of the second complex signal to be output to the first filter and the third complex signal to be output to the second filter, and a second combination of the first complex signal to be output to the first filter means and a signal indicating a value zero to be output to the second filter.

3. The digital filter according to claim 2, wherein the switching is performed by a selection signal sent by an external entity to the signal selection circuit.

4. The digital filter according to claim 3, further including a first filter coefficient generation circuit for generating the first filter coefficient, and a second filter coefficient generation circuit for generating the second filter coefficient.

5. The digital filter according to claim 4, wherein the first filter coefficient generation circuit generates the first filter coefficient from a first complex coefficient and a third complex coefficient, and the second filter coefficient generation circuit generates the second filter coefficient from a second complex coefficient and the third complex coefficient.

6. The digital filter according to claim 5, wherein selection of the first combination is performed when the first complex coefficient is not equal to the second complex coefficient, and selection of the second combination is performed when the first complex coefficient is equal to the second complex coefficient.

7. The digital filter according to claim 5, further including a selection signal generation circuit for generating the selection signal, and outputting the selection signal generated by the selection signal generation circuit to the separation circuit, wherein, when a content corresponding to the second complex coefficient output to the selection signal generator being equal to the third complex coefficient output to the selection signal generator is determined, the selection signal including a content corresponding to the second combination is generated.

8. The digital filter according to claim 7, wherein, when a content corresponding to the second complex coefficient output to the selection signal generation circuit being equal to the third complex coefficient output to the selection signal generation circuit is not determined, the selection signal including a content corresponding to the second combination is generated.

9. A filter processing method including:
generating, by a separation circuit, from a first complex signal in a frequency domain output to the separation circuit, a second complex signal and a third complex signal being a complex conjugate of the second complex signal;
performing switching by selecting, by a signal selection circuit, from among a plurality of types of complex signals having different amounts of change in signal amplitude, at least one of a fourth complex signal and a fifth complex signal, by using the second complex signal and the third complex signal which are output to the signal selection circuit by the separation circuit;
performing filter processing, by a first filter, on the fourth complex signal by a first filter coefficient, and generating a sixth complex signal;
performing processing, by a second filter, on the fifth complex signal by a second filter coefficient, and generating a seventh complex signal; and
combining, by a combining circuit, the sixth complex signal and the seventh complex signal.

10. A recording medium recorded with a filter processing program causing a computer to execute processing including:
processing of generating, by a separation circuit, from a first complex signal in a frequency domain, a second complex signal and a third complex signal being a complex conjugate of the second complex signal;
processing of performing switching by selecting, by a signal selection circuit, from among a plurality of types of complex signals having different amounts of change in signal amplitude, at least one of a fourth complex signal and a fifth complex signal, by using the second complex signal and the third complex signal;
processing of performing filter processing, by a first filter, on the fourth complex signal by a first filter coefficient, and acquiring a sixth complex signal;
processing of performing filter processing, by a second filter, on the fifth complex signal by a second filter coefficient, and acquiring a seventh complex signal; and
processing of combining, by a combining circuit, the sixth complex signal and the seventh complex signal.

* * * * *